United States Patent [19]
Okuda et al.

[11] Patent Number: 5,640,345
[45] Date of Patent: Jun. 17, 1997

[54] SEMICONDUCTOR MEMORY DEVICE AND FABRICATION PROCESS

[75] Inventors: Yasushi Okuda; Takashi Hori; Ichiro Nakao, all of Osaka, Japan

[73] Assignee: Matsushita Electric Industrial Co., Ltd., Osaka, Japan

[21] Appl. No.: 679,319

[22] Filed: Jul. 12, 1996

Related U.S. Application Data

[63] Continuation of Ser. No. 313,605, Sep. 29, 1994, abandoned.

[30] Foreign Application Priority Data

Oct. 1, 1993 [JP] Japan ..................... 5-246533

[51] Int. Cl.⁶ .................................. G11C 11/40
[52] U.S. Cl. .................. 365/184; 365/149; 365/168; 365/185.06; 365/185.01; 257/324; 257/640
[58] Field of Search ...................... 365/185, 168, 365/45, 149, 184, 185.01, 185.06; 257/324, 640

[56] References Cited

U.S. PATENT DOCUMENTS

| | | | |
|---|---|---|---|
| 5,043,940 | 8/1991 | Harari | 365/185 |
| 5,286,994 | 2/1994 | Ozawa et al. | 257/640 |
| 5,294,819 | 3/1994 | Simko | 365/45 |
| 5,319,229 | 6/1994 | Shimoji et al. | 257/324 |
| 5,336,936 | 8/1994 | Allen et al. | 365/185 |

OTHER PUBLICATIONS

I.C. Chen, et al., "Oxide breakdown dependence on thickness and hole current", pp. 660–663, 1986 IEDM Proceeds.

Primary Examiner—Joseph E. Clawson, Jr.
Attorney, Agent, or Firm—McDermott, Will & Emery

[57] ABSTRACT

Provided between a control gate electrode and a channel region of the EEPROM memory cell is a capacitor. Formed on the channel region are a first gate dielectric layer of silicon oxide, a first carrier capture layer of silicon nitride, a carrier migration layer of $n^{31}$ polysilicon, a second carrier capture layer of silicon nitride, and a second gate dielectric layer of silicon oxide. The carrier capture state of the carrier capture layer is changed to generate a polarization state in the capacitor, and the generated polarization state is held as data. The gate dielectric layer is not destroyed since the movement of carriers is limited to within the capacitor, and by adjusting the carrier bound energy, low-voltage drive can be accomplished.

18 Claims, 19 Drawing Sheets

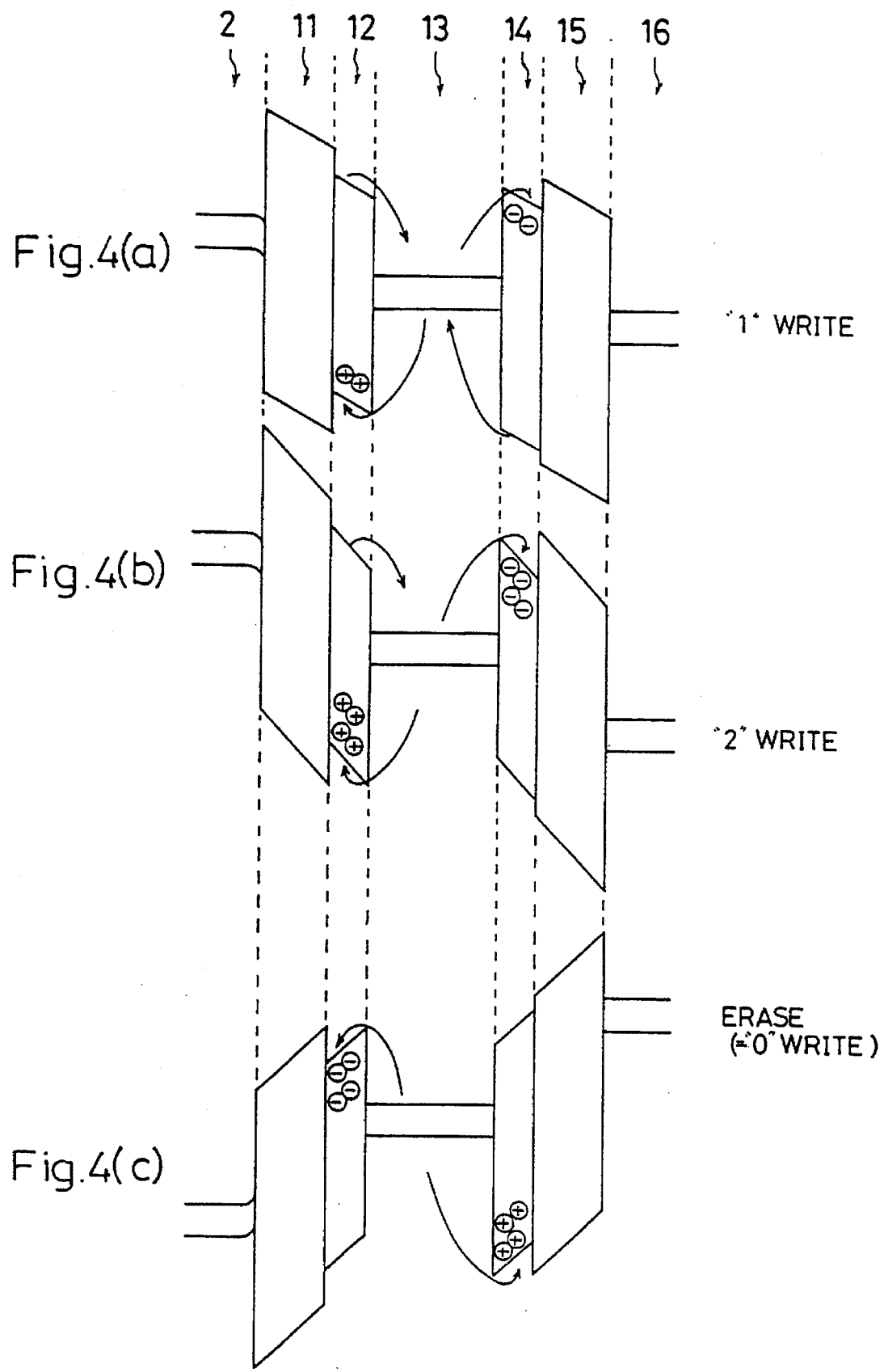

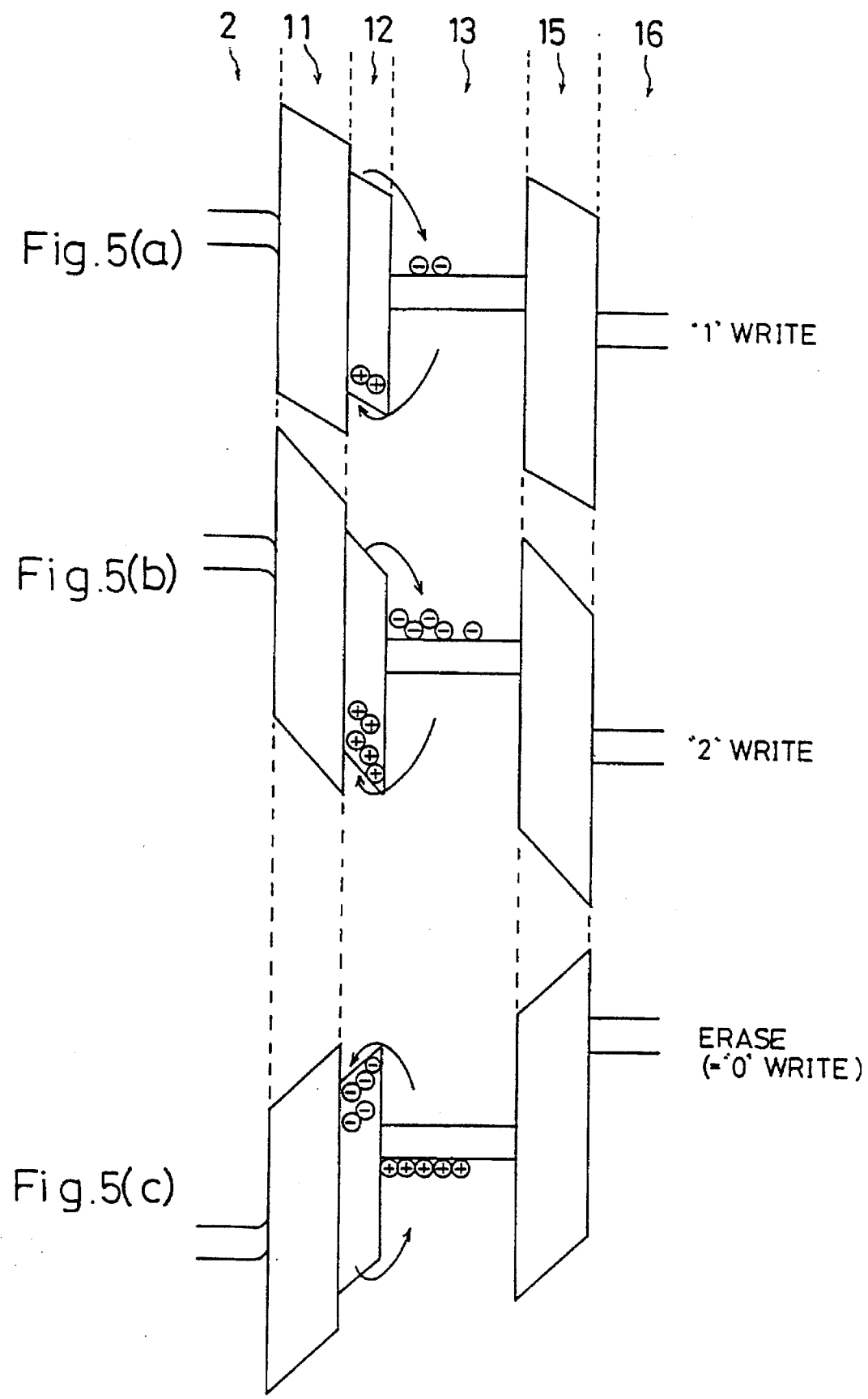

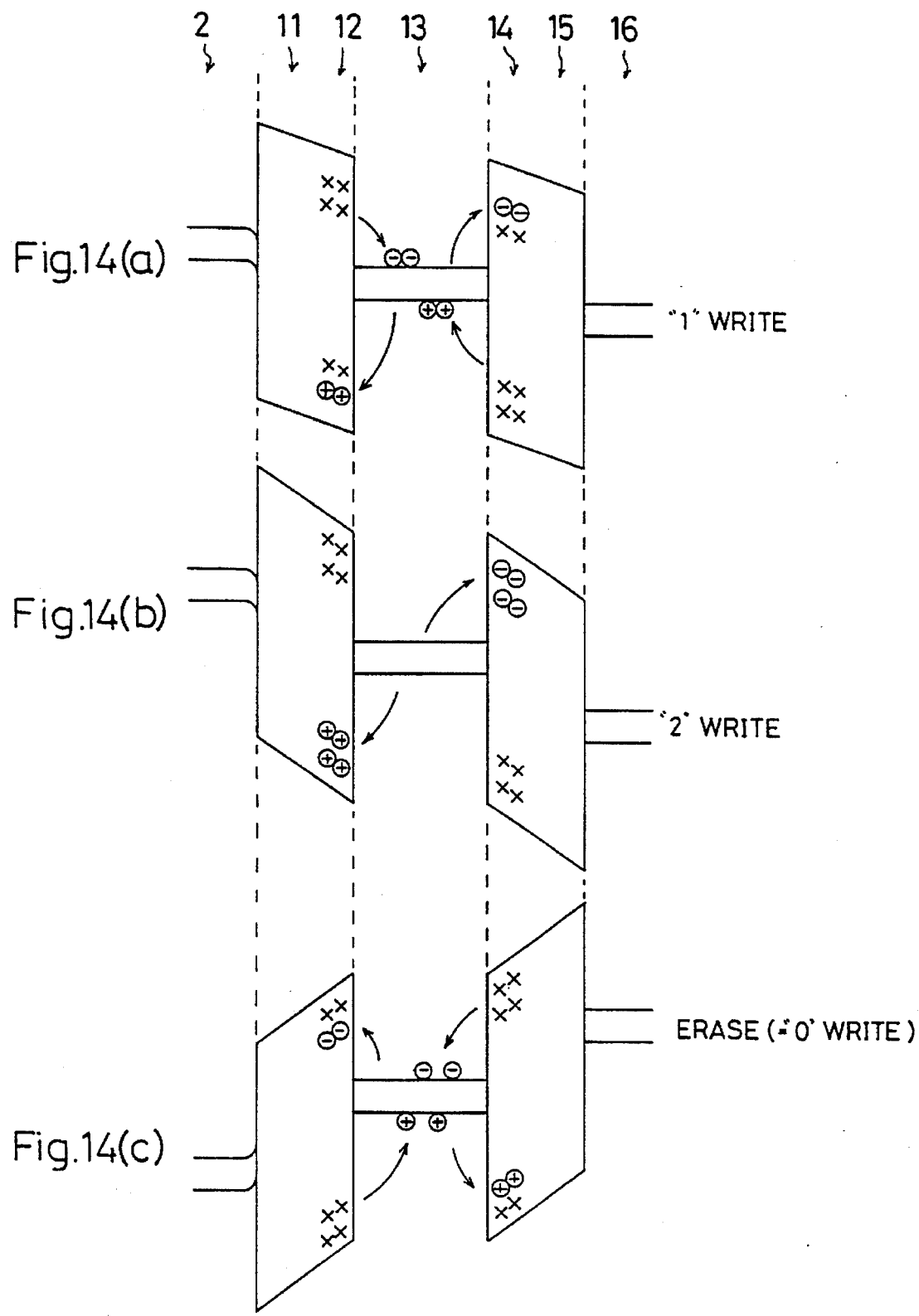

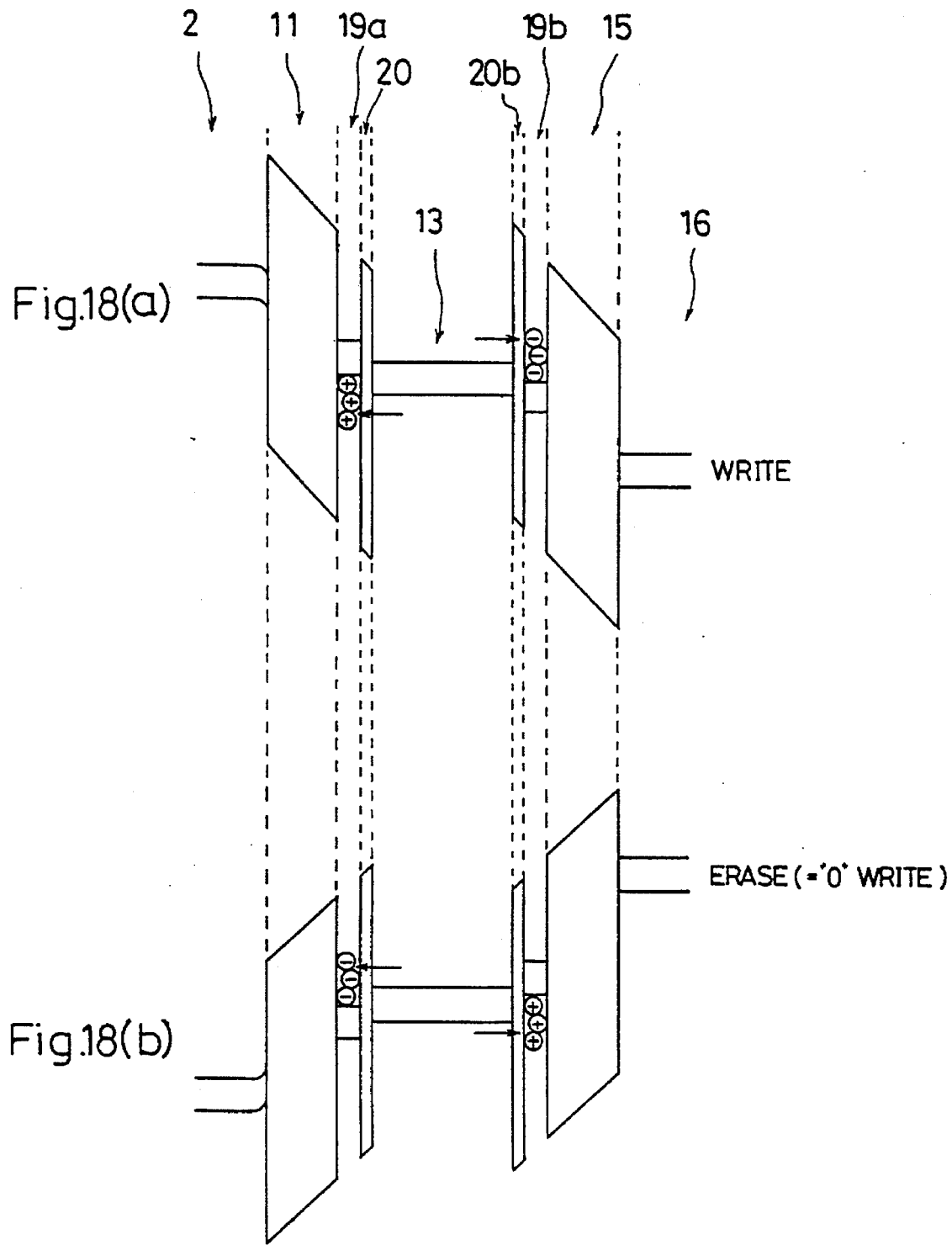

SEMICONDUCTOR MEMORY DEVICE AND FABRICATION PROCESS

This is a continuation application of application Serial No. 08/313,605, filed Sep. 29, 1994 now abandoned.

BACKGROUND OF THE INVENTION

This invention relates to a semiconductor memory device, and to an associated semiconductor memory device fabrication process. More particularly, the present invention pertains to a nonvolatile memory device capable of storing data in accordance with a change in the polarization state caused by a change in the distribution of carriers occurring in a capacitor.

Dynamic random access memory (DRAM), one of the semiconductor memory devices, has been used widely. A typical DRAM is made up of a great number of unit memory cells and each unit memory cell consists of a single capacitor and a switching MOS transistor. A voltage is extracted from a bit line in the form of a signal which represents a particular item of data in a "0"- or "1"-state written into a capacitor of a selected memory cell. The extracted voltage is amplified by a sense amplifier and is read out. In DRAM, the destruction of data occurs by the act of reading the data (destructive read), so refresh must be performed to write such vanished data back to the same location. Additionally, the DRAM has the problem that its stored data volatilizes when the power is turned off.

A flash electrically erasable programmable read-only memory (EEPROM) of a nonvolatile type has some advantages over the DRAM; for example, it has the ability of holding data stored in it without the need for a power supply. A memory cell of a typical EEPROM is formed by a single MOSFET having a so-called stacked gate structure characterized by a floating gate electrode arranged between a control gate electrode and a semiconductor body. An EEPROM of this type stores data in accordance with a change in the threshold voltage of MOSFET depending on the amount of charge stored within the floating gate. In a data write operation, a high voltage is applied to a drain region so as to generate hot carriers, and the generated hot carriers surmount the energy barrier. Then these carriers (e.g., electrons) are injected from the semiconductor body to the floating gate. Alternatively, it is possible to write data by applying to a gate oxide a high electric field, whereby an F-N (Fowler-Nordheim) tunnelling current flows through the gate oxide so that carriers are likewise injected into the floating gate. Conversely, in order to erase stored data, a high electric field in an opposite direction to the above is applied to the gate oxide, so as to shift the injected carriers from the floating gate to the semiconductor body by means of F-N tunnelling. This technique, however, is required to produce a high electric field within a memory cell, thereby making it difficult to accomplish lower-voltage write/erase operations. Further, it is necessary to exchange carriers between the floating gate electrode and the outside when executing a write or erase operation. This is an obstacle to the realization of low power operations. Although a conventional flash EEPROM requires no refresh operations, it takes a prohibitively longer length of time for write/erase operations as compared with a DRAM.

The frequent passage of carriers through a silicon oxide layer forming a gate dielectric layer may cause silicon oxide breakdown. This issue is discussed by I. C. Chen et. al. in a paper entitled "Oxide breakdown dependence on thickness and hole current," International Electron Device Meeting, Technical Digest p. 660–663. This paper suggests that the silicon oxide breakdown is due to a positive feedback effect induced by hole generation and trapping at localized spots. This paper also points out that hole generation requires large electron energy, which decreases with decreasing the film thickness of the silicon oxide. Therefore, ultra thin silicon oxides have superior reliability.

Another type of nonvolatile memory is a nonvolatile RAM (NV-RAM). A typical NV-RAM memory cell is made up of a single MFS (metal-ferroelectric-semiconductor) FET employing a ferroelectric layer as a gate dielectric layer. The state of ion polarization in the ferroelectric layer varies with the application direction of an electric field, so that the threshold voltage of a MFSFET likewise varies. Such a change is used to store data.

Japanese Patent Application Gazette No. 4-97564 shows a semiconductor memory device. In accordance with this prior art technique, an ion polarization in a ferroelectric layer is made to look as if it is replaced with a polarization by an "electric dipole". This semiconductor memory device is built up employing a FET structure having a drain region and a source region each formed on a Si substrate surface region and a gate electrode (see FIG. 19a). Sandwiched between the gate electrode and the Si substrate is a capacitor made up of a plurality of layers. In this capacitor, plural active regions, arranged between dielectric layer barriers, correspond to respective unit crystal lattices of the ferroelectric layer. As shown in FIG. 19b, depending on the applied electric field, carriers comes and goes through a tunnelling barrier provided within each active region. As a result, the carriers are localized to store data.

The above-described electric dipole structure provides some advantages. For example, since a tunnelling layer through which carriers migrate is considerably thin, this reduces the amount of energy necessary for a carrier to migrate. As a result, breakdown due to the passage of carriers hardly occurs. However, the magnitude of dipole moment induced by the electric dipole is a product of the magnitude of charge times the positive-to-negative charge distance. So, even if carriers are localized through a very thin tunnelling layer, it is impossible to produce a large dipole moment. Therefore, the change in electric field produced by the electric dipole is too small to read data from changes in the characteristic of current flowing between the underlying drain and source regions. If the film thickness of the tunnelling layer is increased, then a voltage required for performing a data write (or erase) operation becomes high. As a result, power consumption is increased. Additionally, the amount of energy, too, increases and silicon oxide breakdown may occur.

SUMMARY OF THE INVENTION

The present invention is directed to an improved semiconductor memory device and associated fabrication method. It is therefore a main object of the present invention to provide a technique capable of low-voltage drive and of providing high data hold performance. In accordance with the present invention, a capacitor is provided which has such a structure that the state of carrier polarization depends on the applied voltage and a means is provided which changes dipole moment resulting from polarization taking place in the capacitor.

The present invention provides a semiconductor memory device comprising:
  at least one unit memory cell Including a capacitor to store information, the capacitor being provided between a first conductive element and second conductive element;

the capacitor including:
- a first barrier layer which is located next to the first conductivity type element and which has an energy barrier that is so high as to impede the passage of carriers;
- a carrier migration layer which faces the first conductive element with the first barrier layer inbetween and which has an energy level capable of permitting the migration of carriers;
- a second barrier layer which is provided between the carrier migration layer and the second conductive element and which has an energy barrier that is so high as to impede the passage of carriers; and
- at least one carrier capture layer which is provided between the carrier migration layer and the first barrier layer or between the carrier migration layer and the second barrier layer and which has an energy level capable of capturing a carrier;
- wherein the capacitor is formed in a way such that, by changing a carrier capture state of the carrier capture layer in accordance with a change in binary voltage applied between the first conductive element and the second conductive element, at least two different polarization states can be generated and stored as stored data.

As a result of the above-described arrangement, the intra-capacitor polarization state varies with the voltage applied between the first conductive element and the second conductive element. This produces a polarization state corresponding to a voltage applied between these two different elements to be stored in the form of data. Even if the film thickness of the carrier migration layer is made thicker, less energy is required. Therefore, it is possible to make a polar-to-polar distance much greater, thereby producing a considerably great dipole moment. As a result, a high-performance data hold function can be accomplished. Additionally, by adequately controlling carrier capture levels, it becomes possible to make the amount of energy, used to change a carrier capture state, much lower than the amount of energy necessary for carriers to pass through a dielectric layer. Therefore, the applied voltage between the first conductive element and the second conductive element, used to change a polarization state in the capacitor, is considerably reduced as compared with a voltage for generating an F-N current and hot carriers. This allows a semiconductor memory device to be operable at a lower voltage.

It is preferable that the carrier capture layer is made up of at least one thin film that has an energy level capable of capturing a carrier. It is preferable that each barrier layer is made up of silicon oxide and that the carrier capture layer is made up of at least silicon nitride. As a result of such arrangement, traps are formed in areas in the vicinity of a boundary between the silicon nitride layer and the silicon oxide layer, to capture carriers.

It is preferable that the carrier capture layer is within at least one of the two barrier layers and includes a trap formed in the vicinity of an interface between the carrier capture layer and the carrier migration layer. It is preferable that either one of the two barrier layers is formed by silicon oxide, that the carrier migration layer is formed by silicon having a low carrier concentration, and that the trap of the carrier capture layer is formed by a Group IV compound that is introduced into the silicon oxide barrier layer. As a result of such arrangement, the structure of the unit memory cell is simplified thereby reducing the cost of production. Additionally, Group IV compounds ions (e.g., silicon ions), implanted into silicon oxide, do not ill-influence the carrier concentration of a silicon layer serving as a carrier migration layer, thereby improving the state of intracapacitor polarization.

It is preferable that a value, found by dividing the carrier migration layer's film thickness by the carrier migration layer's dielectric constant, is greater than a value found by dividing each barrier layer's film thickness by each barrier layer's dielectric constant. This increases dipole moment by polarization.

It is preferable that a value, found by dividing the carrier capture layer's film thickness by the carrier capture layer's dielectric constant is less than a value found by dividing the carrier migration layer's film thickness by the carrier migration layer's dielectric constant. This reduces the variation in carrier distribution and data is stored in a more accurate manner.

It is preferable that a tunnelling barrier layer is provided between the carrier capture layer and the carrier migration layer wherein the tunnelling barrier layer is formed in a way such that carriers can pass through the tunnelling barrier by tunnelling. This gives the carrier capture layer an improved carrier hold function, and the data hold function is improved as well.

It is preferable that the carrier capture layer is formed on both sides of the carrier migration layer. As a result of such arrangement, one of the two carrier capture layer becomes a positive pole, whereas the other carrier capture layer becomes a negative pole, and this results in producing a greater change in electric field.

It is preferable that a tunnelling barrier layer is provided between each carrier capture layer and the carrier migration layer, the tunnelling barrier layer being formed in a way such that carriers can pass through the tunnelling barrier by tunnelling. As a result of such arrangement, the adjustment of energy to constraint carriers in the carrier capture layer becomes easy.

It is to be noted that, instead of employing the above-described carrier capture layer, two carrier store layers each of which has an energy level capable of allowing carriers to exist in a stable state, may be provided. As a result of such arrangement, the carrier storing state of these two carrier store layers varies with the value of two voltages applied between the first and second conductive elements. Therefore, it is possible to store at least two polarization states as stored data.

A unit memory cell having the above-described structure may be applicable in flash EEPROMs. In such a case, the first conductive element is made to serve as a channel region between a source region and a drain region of a flash EEPROM, while on the other hand the second conductive element is made to serve as a control gate electrode. Because of such arrangement, the capacitor corresponds to a floating gate of the flash EEPROM and dielectric layers provided on both sides of the floating gate. An EEPROM memory cell, which is drivable at a lower voltage and which has highly reliable performance, is obtainable.

The above-described unit memory cell may be used as a DRAM memory cell and the capacitor may be used as a storage capacitor connected between a storage node and a plate electrode of the DRAM memory cell. This constructs a nonvolatile DRAM memory cell.

The above-described semiconductor memory further comprises:
- a binary write means; and
- a data read means;

wherein:

the binary write means produces a predefined potential difference between the first and second conductive elements thereby writing a resulting polarization state occurring in the capacitor as "1" data, while, on the other hand, the binary write means produces an opposite potential difference to the "1" data write potential difference between the first and second conductive elements thereby writing a resulting polarization state occurring in the capacitor as "0" data; and the read means produces between the first and second conductive elements a potential difference which is lower than any of the "1" data write potential difference and the "0" write potential difference produced by the binary write means and which does not affect any of the intracapacitor polarization states, thereby reading data, written by the binary write means, on the basis of a change in conductive characteristic of at least one of the first and second conductive elements caused by the intracapacitor polarization states.

Additionally, instead of employing the binary write means, a multi-value write means or an analog data write means may be used.

The present invention provides a semiconductor memory device fabrication process comprising:

a step of forming a first conductive element;

a step of first forming on the first conductive element a first barrier layer that has an energy barrier that is so high as to impede the passage of carriers, and forming on the first barrier layer a first carrier capture layer that has an energy level capable of capturing a carrier;

a step of forming on the first carrier capture layer a carrier migration layer that has an energy level capable of permitting the migration of carriers;

a step of forming on the first carrier migration layer a second barrier layer that has an energy barrier that is so high as to impede the passage of carriers; and a step of forming on the second barrier layer a second conductive element.

Instead of carrying out a step of forming the second barrier layer, a second carrier capture layer having an energy level capable of capturing a carrier and a second barrier layer having an energy level capable of impeding the passage of carriers may be formed on the carrier migration layer.

BRIEF DESCRIPTION OF THE DRAWINGS

FIGS. 4a–4c are descriptive diagrams showing the relationship of the gate control voltage versus the carrier capture state in relation to FIG. 1.

FIGS. 5a–5c are descriptive diagrams showing the relationship of the gate control voltage versus the carrier capture state in relation to FIG. 2.

FIGS. 14a–14c are descriptive diagrams showing the relationship of the gate control voltage versus the carrier capture state in relation to FIG. 11.

FIGS. 18a–18b are descriptive diagrams showing the relationship of the gate control voltage versus the carrier capture state, in relation to the fourth embodiment.

PREFERRED EMBODIMENTS OF THE PRESENT INVENTION

EXAMPLE 1

Figure 1A:
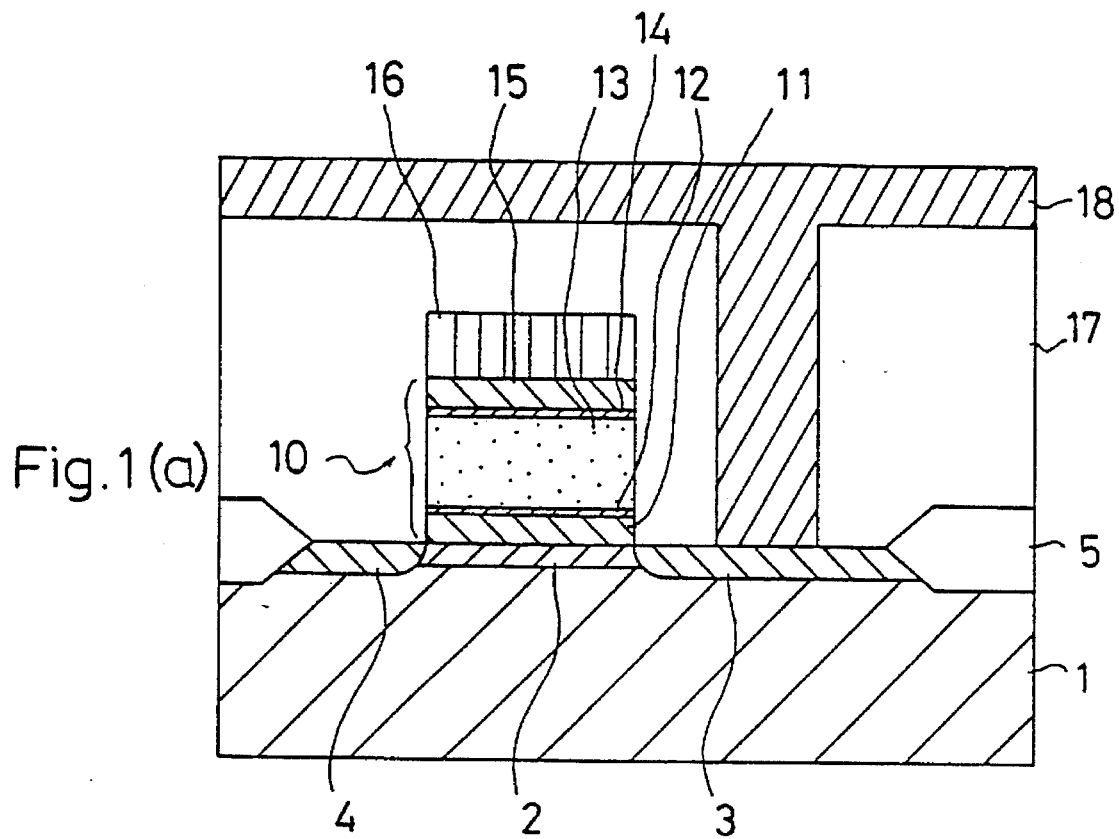
FIG. 1a shows in cross section an EEPROM memory cell having two carrier capture layers in accordance with a first embodiment of the present invention.

Referring now to FIGS. 1–7, a first preferred embodiment of the present invention is described. Shown in FIG. 1 are p-type silicon substrate 1, channel region 2 that functions as a first conductive element, drain region 3 that is heavily doped with an n-type impurity, source region 4 that is heavily doped with an n-type impurity, and isolation 5. Further shown in FIG. 1 are first gate dielectric layer 11 which is made up of about 10 nm-thick $SiO_2$ and which functions as a first barrier layer, first carrier capture layer 12 which is made up of about 8 nm-thick $Si_3N_4$, carrier migration layer 13 which is made up of about 400 nm-thick $n^{31}$ polysilicon, second carrier capture layer 14 which is made up of about 8 nm-thick $Si_3N_4$, and second gate dielectric layer 15 which is made up of about 10 nm-thick $SiO_2$ and which functions as a second barrier layer. Capacitor 10 is composed of first gate dielectric layer 11, first carrier capture layer 12, carrier migration layer 13, second carrier capture layer 14, and second gate dielectric layer 15. A control gate electrode (word line) 16 is made up of about 250 nm-thick polysilicon which functions as of a second conductive element. An interlayer dielectric film 17 is made up of BPSG. Reference numeral 18 indicates a bit line. In other words, a memory cell of the present embodiment has a single MFSFET including channel region 2, drain region 3, source region 4, and control gate electrode 16, and capacitor 10 is provided between control gate electrode 16 and channel region 2. Such an organization almost corresponds to a conventional flash EEPROM memory cell organization, and portions excluding first and second gate dielectric layers 11 and 15, or first carrier capture layer 12, carrier migration layer 13, and second carrier capture layer 14 together make up a structure corresponding to a floating gate electrode of a PROM memory cell.

Figure 1B:
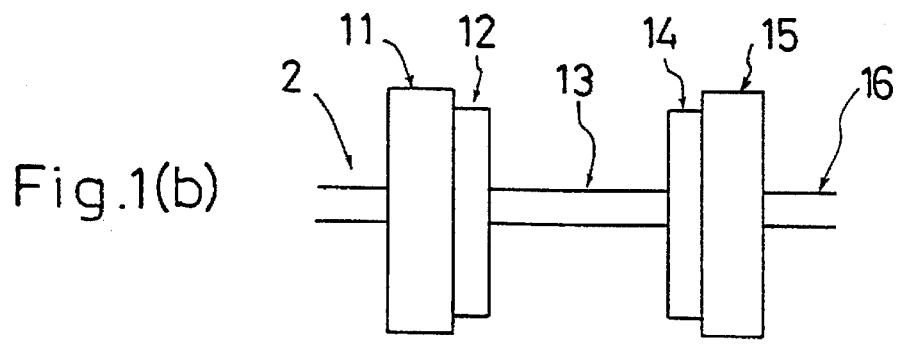
FIG. 1b is an associated energy band diagram.

FIG. 1b shows an energy band structure from channel region 2 to control gate electrode 16. As shown in FIG. 1b, first gate dielectric layer 11 and second gate dielectric layer 15 each have an energy barrier that is so high as to impede the passage of carriers. With regard to first and second carrier capture layers 12 and 14, they have energy levels capable of capturing carriers. Carrier migration layer 13 has an energy level capable of permitting the migration of carriers. A change in the polarization state according to a change in the carrier capture state within first and second carrier capture layers 12 and 14 is made to correspond to stored data, and such a polarization state within capacitor 10 is held.

A tunnelling barrier layer of silicon oxide that is so thin as to enable tunnelling may be provided between first (second) carrier capture layer 12 (14) and carrier migration layer 13. As a result of such arrangement, bound force to hold carriers is increased, thereby improving data hold performance at the time when write or read operations are executed.

Figure 2A:
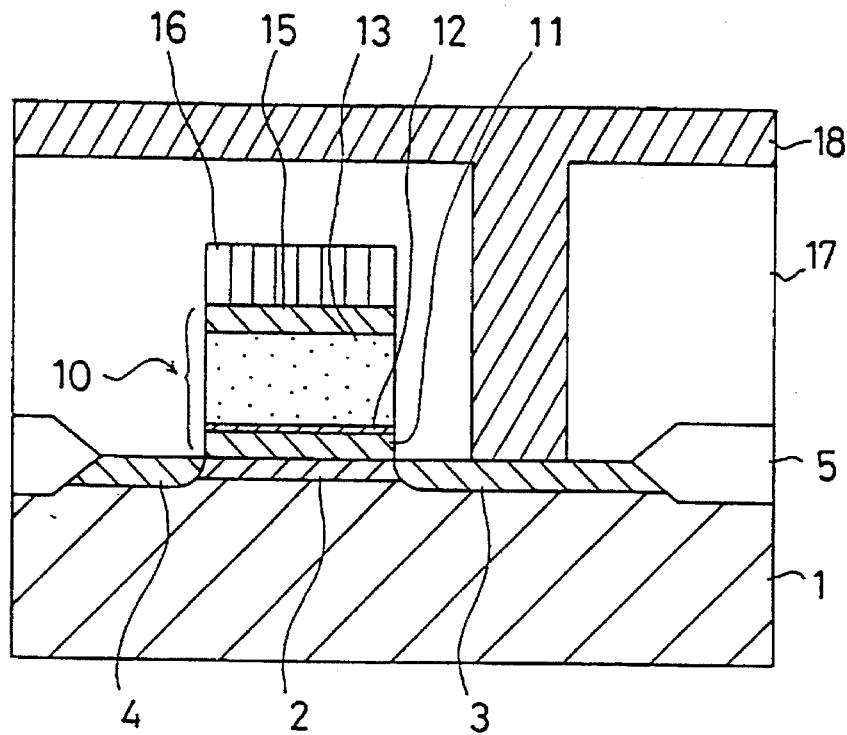
FIG. 2a shows in cross section an EEPROM memory cell having a single carrier capture layers In accordance with the first embodiment.
Figure 2B:
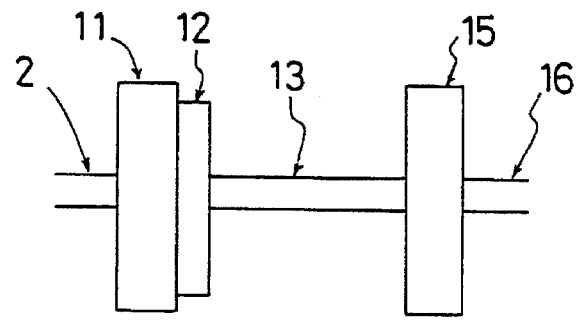
FIG. 2b is an associated energy band diagram.

FIG. 2a is similar to FIG. 1a except for second carrier capture 14. More specifically, in an EEPROM memory cell of FIG. 2a, capacitor 10 is formed by first gate dielectric layer 11, carrier capture layer 12, carrier migration layer 13, and second gate dielectric layer 15. FIG. 2b shows an energy band structure of FIG. 2a. With this structure, almost the same effects as the FIG. 1a structure are obtained, which will be described later.

Referring now to FIGS. 3a–e, the fabrication of a memory cell having a structure of FIG. 2a is illustrated.

Figure 3A:
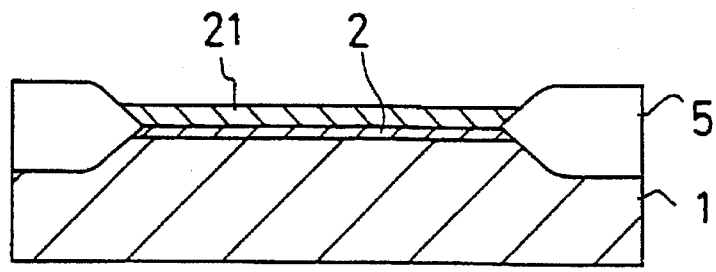
FIGS. 3a–3e depict in cross section subsequent steps of the fabrication of an EEPROM memory cell in accordance with the first embodiment.

In the first place, as shown in FIG. 3a, isolation 5 is formed on p-type silicon substrate 1. This is followed by an implantation of boron ions into an active region (with a passivation oxide layer formed on the surface) to form channel region 2. The passivation oxide layer is removed. A surface of silicon substrate 1 is thermal-oxidized at a temperature of 900 degrees centigrade, to deposit silicon oxide layer 21 having a film thickness of 10 nanometers.

Figure 3B:
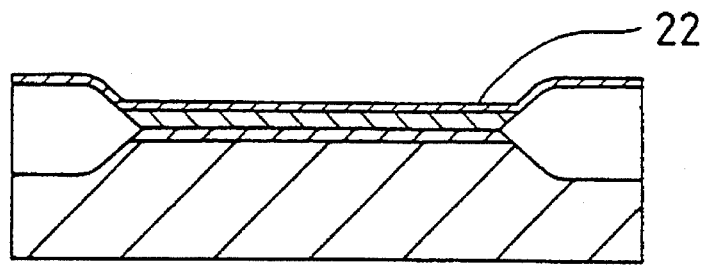
Figure 3C:
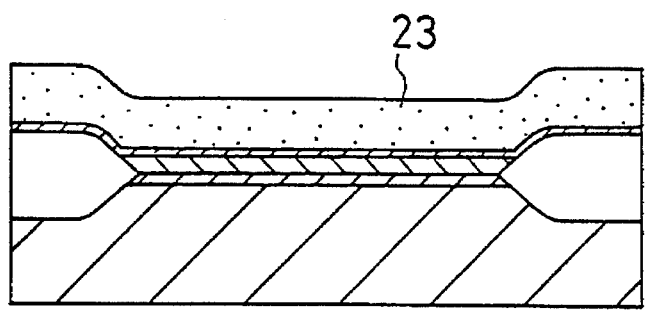

Next, as shown in FIG. 3b, silicon nitride layer 22 having a film thickness of 8 nanometers is deposited on silicon oxide layer 21 by means of a low-pressure CVD process. Then, polysilicon layer 23, which is lightly doped with arsenic, is deposited about 400 nanometers at, for example, a temperature of 650 degrees centigrade (see FIG. 3c).

Figure 3D:
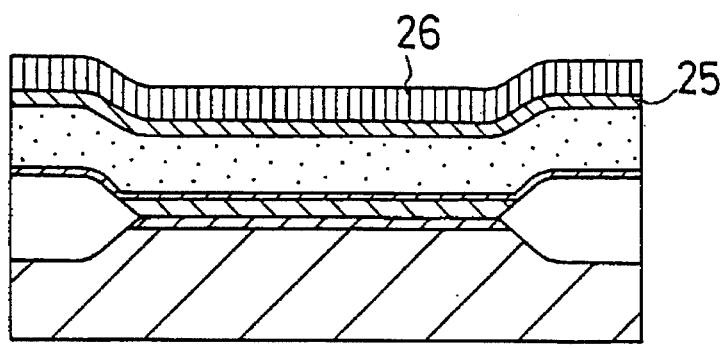

Next, as shown in FIG. 3d, silicon oxide layer 25 is deposited 10 nanometers, and n-type polysilicon layer 26, which is doped with phosphorus, is deposited about 250 nanometers at, for example, a temperature of 650 degrees centigrade.

Figure 3E:
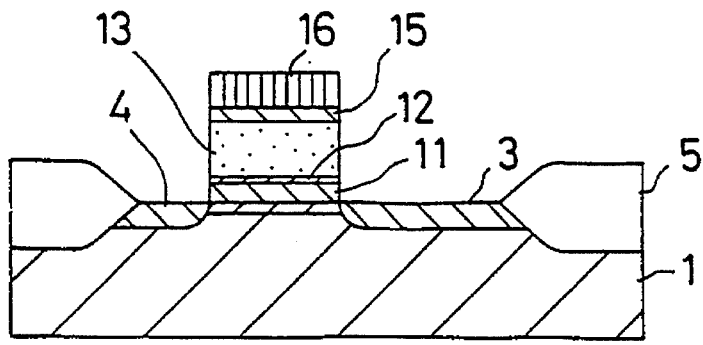

Thereafter, as shown in FIG. 3e, these plural layers thus formed are subjected to a patterning process to form first and second gate dielectric layers 11 and 15 of silicon oxide, first carrier capture layer 12, carrier migration layer 13, and control gate electrode 16. By making use of a result of such a patterning process as a mask, an implantation of phosphorus ions is carried out to form drain region 3 and source region 4. The subsequent fabrication steps are not described. Note that interlayer dielectric film 17 and bit line 18 are formed using techniques known in the art. With the above-described fabrication steps, the memory cell of FIG. 2a is fabricated.

The fabrication of a memory cell having a structure of FIG. 1a is not described here; however, the memory cell of FIG. 1a may be formed as follows. A silicon nitride layer, which becomes second carrier capture layer 14, is formed on polysilicon layer 23 upon completion of a step of FIG. 3c, and a step of FIG. 3d is performed to complete a memory cell of FIG. 1a.

The variation in carrier distribution (i.e., the variation in polarization), at the time when information is written into a memory cell in accordance with FIG. 1a or FIG. 2a, is described. FIGS. 4a–c(FIGS. 5a–c) are diagrams each of which illustrates how the energy band of the memory cell of FIG. 1a(2a) and the distribution of electrons vary with a voltage, $V_g$, applied between control gate electrode 16 and channel region 2 (hereinafter called the control gate voltage or $V_g$). FIGS. 4a–c are for the memory cell of FIG. 1a and FIGS. 5a–c are for the memory cell of FIG. 2a. For the case of the memory cell of FIG. 1a, if $V_g=V_{w1}(=+3V)$ where $V_{w1}$ is the "1" write voltage, electrons in first carrier capture layer 12 are released to carrier migration layer 13 and these released electrons are captured by second carrier capture layer 14 (see FIG. 4a). As a result, first carrier capture layer 12 is charged positive thereby becoming a positive pole, while on the other hand second carrier capture layer 14 is charged negative thereby becoming a negative pole. In other words, a polarization takes place in capacitor 10. On the other hand, for the case of the memory cell of FIG. 2a, if $V_g=V_{w1}$, electrons in first carrier capture layer 12 are released to carrier migration layer 13, as a result of which a polarization occurs, whereby first carrier capture layer 12 becomes a positive pole and carrier migration layer 13 becomes a negative pole. If $V_g=V_{w2}(=+4\ V)$ where $V_{w2}$ is the "2" write voltage, then, as shown in FIG. 4b(5b), the amount of carriers of the positive pole and the amount of carriers of the negative pole increase. As a result, the amount of polarization increases. If $V_g=V_{w0}(=-4\ V)$, where $V_{w0}$ is the erase (i.e., "0" write) voltage, for the case of the memory cell of FIG. 1a, electrons of second carrier capture layer 14 are released into carrier migration layer 13 and these released electrons are captured by first carrier capture layer 12. As a result, a polarization takes place causing first and second carrier capture layers 12 and 14 to become a negative pole and a positive pole, respectively. For the case of the memory cell of FIG. 2a, as shown in FIG. 5c, if $V_g=V_{w0}(=-4\ V)$, then electrons of carrier migration layer 13 are released to first carrier capture layer 12. As a result, a polarization occurs causing first carrier capture layer 12 to become a negative pole and causing carrier migration layer 13 to become a positive pole.

Figure 6A:
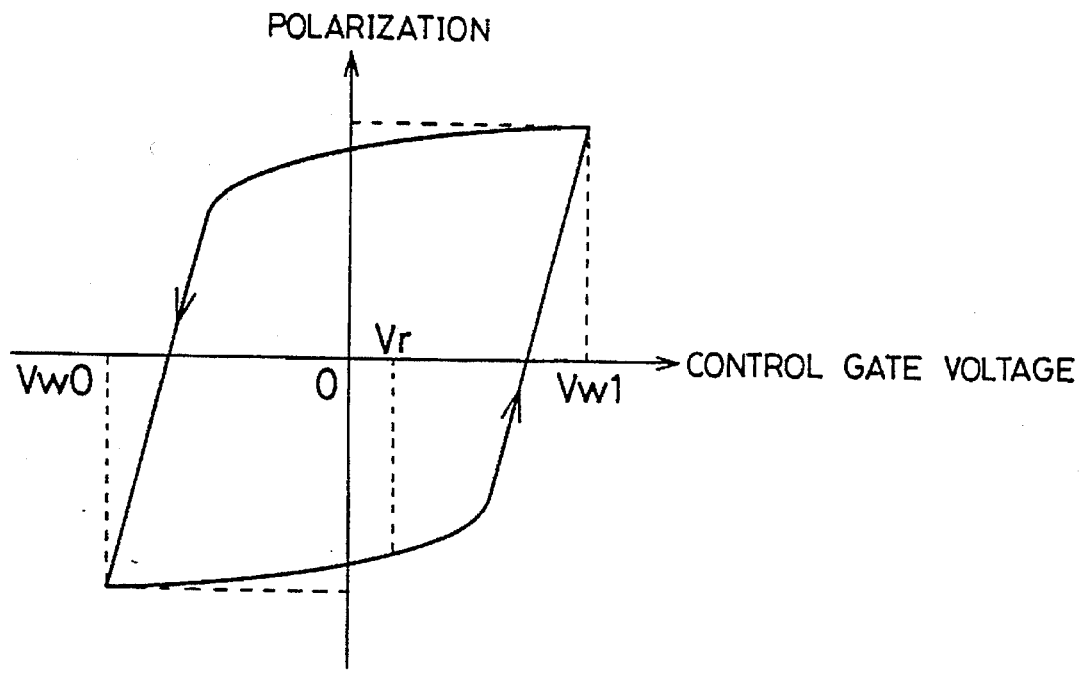
FIG. 6a is a diagram showing hysteresis characteristics of a polarization occurring in a memory cell at the time when binary write operations are executed.

The characteristic of the above-described polarization is explained below. If $V_{w1}$ ($V_{w0}$) is applied across capacitor 10, the amount of polarization in capacitor 10 indicates hysteresis characteristics as shown in FIG. 6a. Capacitor 10 has a polarization state indicating hysteresis as shown in FIG. 4a, so that, if $V_g=V_{w1}$, then a polarization occurs causing first carrier capture layer 12 to become a positive pole and causing carrier migration layer 13 to become a negative pole. As a result, a write operation of "1" data is completed. Even if $V_g$ returns to 0 V thereafter, there still exists a residual polarization between first carrier capture layer 12 and second carrier capture layer 14 (or between first carrier capture layer 12 and carrier migration layer 13). This means that the "1" data is still retained. On the other hand, if $V_g=V_{w0}$, then a polarization occurs causing first carrier capture layer 12 to become a negative pole and causing second carrier capture layer 14 (or carrier migration layer 13) to become a positive pole. As a result, the memory cell enters the erase state (i.e., the "0" write state). Even if $V_g$ returns to 0 V, there still exists a residual polarization between first carrier capture layer 12 and second carrier capture layer 14 (or between first carrier capture layer 12 and carrier migration layer 13). This means that the "0" data is still retained. To sum up, by making use of the above-described polarization hysteresis characteristics, the write operation of "1" data and the write of "0" data (i.e., the erase operation) can be executed.

The present embodiment has been explained in terms of the binary write operation. However, the trinary write operation may be done basically the same way as the binary write operation. FIG. 7a shows hysteresis characteristics of polarization in the case of storing a trinary state. By setting $V_g$ at $V_{w1}$, $V_{w2}$, or $V_{w0}$, the write operation of "1" data, the write operation of "2" data, or the write operation of "0" data can be executed.

Figure 6B:
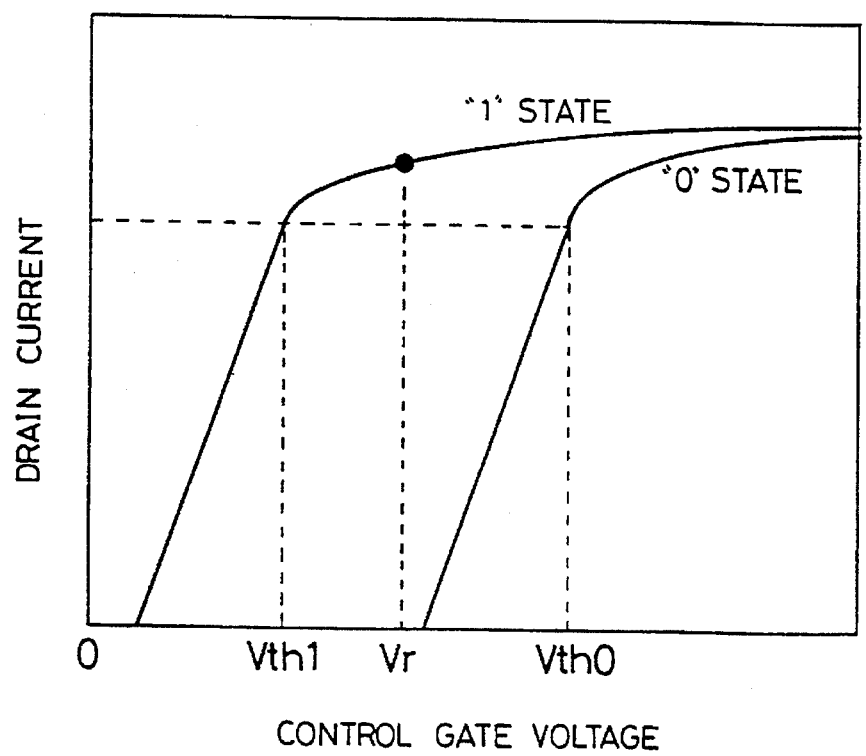
FIG. 6b is a diagram showing the relationship between the control gate voltage and the drain current of a FET.

Next, the read operation of data is described below. FIG. 6b shows the relationship of $V_g$ versus Id (i.e.; drain current) in the case of the writing operation of "1" data and "0" data to a memory cell. In other words, FIG. 6b shows operational characteristics of a transistor in the memory cell. In a "1"-state memory cell, whereas first carrier capture layer 12 is charged positive, carrier migration layer 13 is charged negative. Therefore, the transistor threshold voltage drops down to $V_{th1}$. On the other hand, in a "0" state memory cell, whereas first carrier capture layer 12 is charged negative, carrier migration layer 13 is charged positive. Therefore, the transistor threshold voltage increases up to $V_{th0}$. If $V_g=V_r$ where $V_r$ is a voltage whose value safely lies between $V_{th0}$ and $V_{th1}$ so as not to affect an existing polarization state, a transistor will turn on if the memory cell is in the "1" state while on the other hand it will not turn on if the memory cell is in the "0" state. As a result of such arrangement, it becomes possible to read data based on the difference in the value of Id drain current that flows through a transistor bit line.

Figure 7:
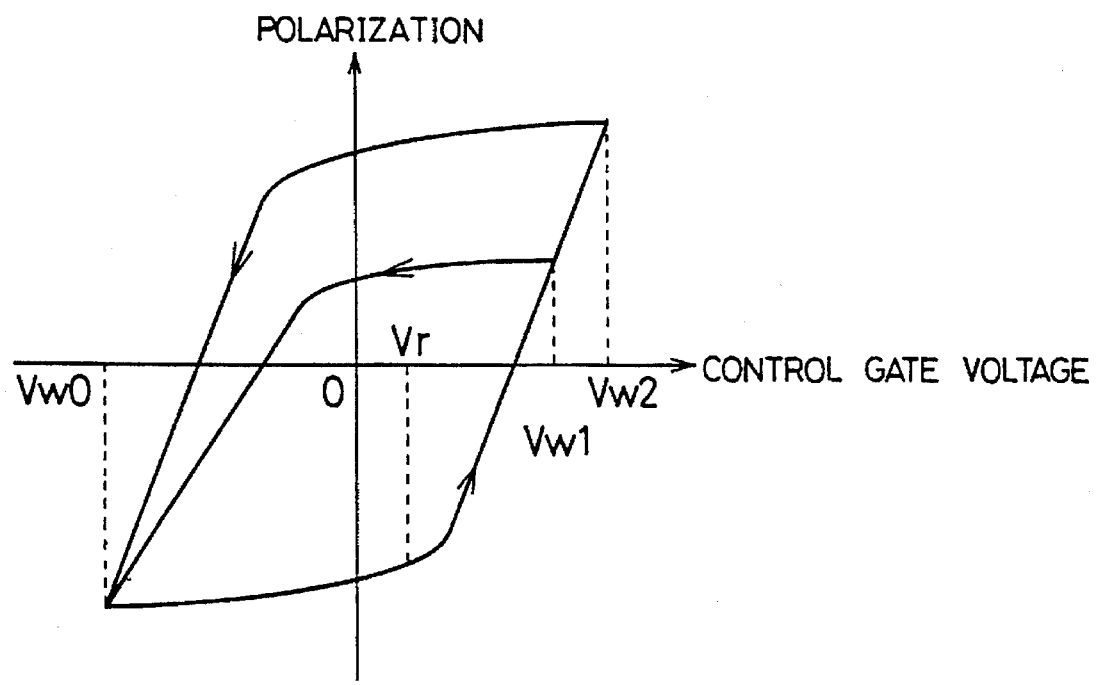
FIG. 7a is a diagram showing hysteresis characteristics of a polarization occurring in a memory cell at the time when trinary write operations are executed.
FIG. 7b is a diagram showing the relationship between the control gate voltage and the drain current of a FET.
Figure 7B:
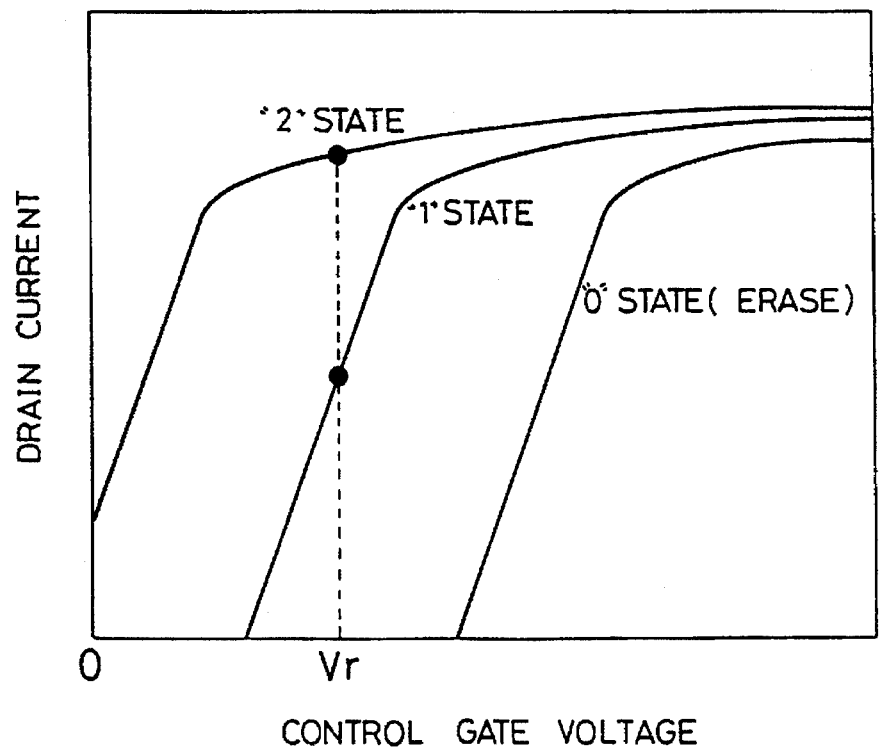

FIG. 7b shows the relationship of $V_g$ versus Id in the case of the write operations of "1" data, "2" data, and "0" data to a memory cell. Like FIG. 6b, the read operation of these three values can be executed based on the difference in the value of Id created by the application of $V_r$ read voltage.

In the above-described memory cell, the bound energy of electrons in first carrier capture layer 12 is controlled, so that the polarization state of first carrier capture layer 12 and second carrier capture layer 14 (or carrier migration layer 18) can remain almost unchanged even if $V_r$ is applied. Therefore, the memory cell retains its stored data (i.e. the nondestructive read). For example, for the case of the write operations of "1", "2", and "0" wherein the bound energy is set in a way such that $V_g$ is about 2.5 V to cause hysteresis, it is feasible to perform a write operation of "2" at a $V_g$ less than or equal to +4 V, to perform a write operation of "1" at a $V_g$ less than or equal to +3 V, and to perform a write operation of "0" (erase) at a $V_g$ less than or equal to 4 V, and it is also possible to perform a read operation at a $V_g$ less than or equal to +1 V. In accordance with the memory cell of the present embodiment, it is possible to carry out write/read operations of three or more values.

Figure 8:
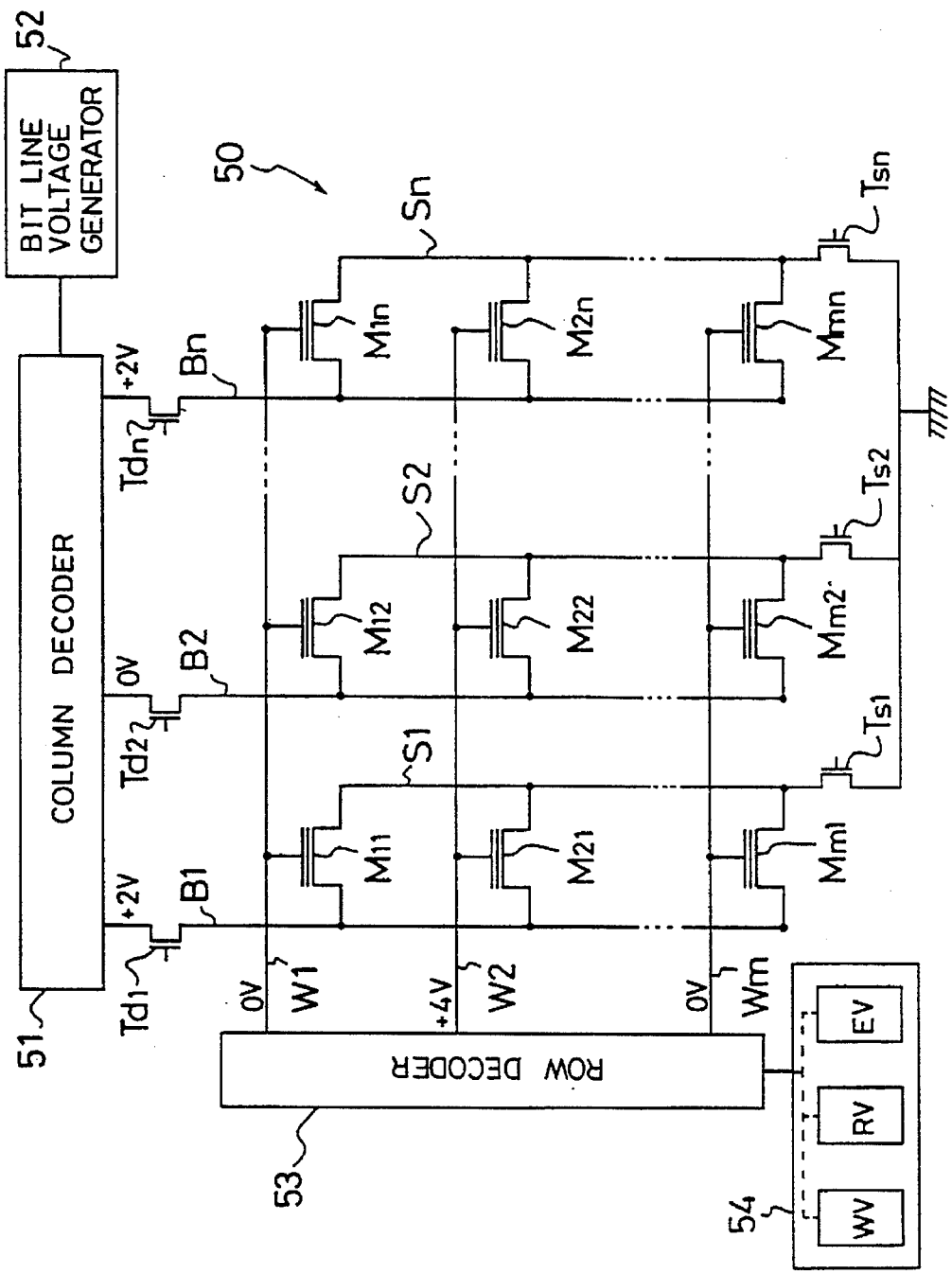
FIG. 8 is a circuit diagram illustrating the write operation of data in a memory cell array of a flash EEPROM formed by memory cells of the first embodiment.

FIG. 8 shows the organization of a flash EEPROM incorporating thereinto a memory cell of FIG. 1. Referring now to FIG. 8, write and read are illustrated below. This flash EEPROM includes the following elements: memory cell array 50, column decoder 51, bit line voltage generator 52, row decoder 53, and word line voltage generator 54. Memory cell array 50 contains a great number of memory cells $M_{11}$–$M_{mn}$ arranged to look like a grid. Column decoder 51 makes a selection among bit lines $B_1$–$B_n$, respectively associated with memory cells $M_{11}$–$M_{mn}$. Bit line voltage generator 52 is operable to generate voltages for bit lines $B_1$–$B_n$. Row decoder 53 makes a selection among word lines $W_1$–$W_m$ respectively associated with memory cells $M_{11}$–$M_{mn}$. Word line voltage generator 54 is operable to generate voltages for word lines $W_1$–$W_m$. Provided inside word line voltage generator 54 are write voltage generator W, read voltage generator RV, and erase voltage generator EV. $T_{d1}$–$T_{dn}$ are bit line switching transistors and $T_{sl}$–$T_{sn}$ are source line switching transistors.

Write, read, and erase in a flash EEPROM memory cell of the present embodiment are described. When writing "1" data into memory cell $M_{22}$, word line $W_2$, a selected word line, is so set as to have an electric potential of +4 V, while each of the remaining nonselected word lines is so set as to have a ground electric potential (i.e., 0 V). Bit line $B_2$, a selected bit line, is so set as to have an electric potential of 0 V, while, on the other hand, each of the remaining nonselected bit lines is so set as to have an intermediate electric potential of +2 V (i.e., one-half the write voltage). The source electric potential is set in a floating condition. As a result, only memory cell $M_{22}$ has a control gate electrode-to-channel region potential difference $V_{w1}$ and a write operation of "1" data is executed.

In the case of the write operation of "0"(erase), a memory cell is set to have a substrate electric potential of 0 V and –4 V is applied to each word line (i.e., control gate electrode 16). This erases all of the data items stored in memory cells $M_{11}$–$M_{mn}$.

For the case of the write operation of three or more values, it is possible to perform "1", "2", and "0" operations if the electric potential of a selected word line (i.e., word line $W_2$) of FIG. 2 is multi-valued.

Figure 9:
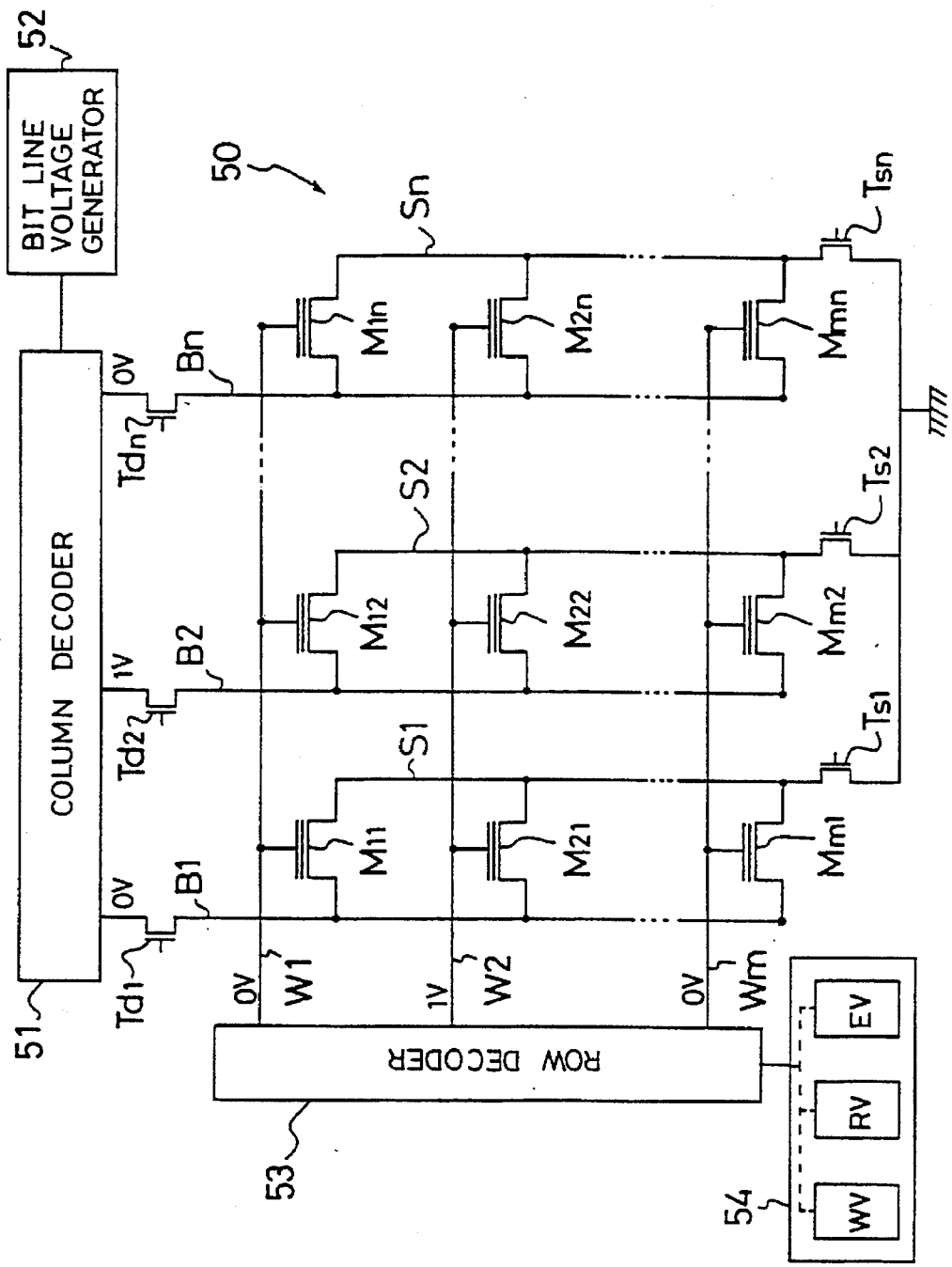
FIG. 9 is a circuit diagram illustrating the read operation of data in a memory cell array of a Flash EEPROM formed by memory cells of the first embodiment.

Next, the operation of read from, for example, memory cell $M_{22}$ is explained. As shown in FIG. 9, word line $W_2$ is set to have an electric potential of 1 V, while each of the remaining nonselected word lines is set to have an electric potential of 0 V. Bit line $B_2$, a selected bit line, is set to have an electric potential of 1 V, while each of the remaining nonselected bit lines is set to have an electric potential of 0 V. Then, by detecting a current flowing through bit line $B_2$, stored data of memory cell $M_{22}$ can be read out.

The semiconductor memory device of the present embodiment does not rely on the F-N current or the hot carrier implantation requiring a high electric field at the time when write/erase operations are executed. Therefore, it is possible to execute write/erase operations at a lower voltage by adjusting carrier capture levels of first and second carrier capture layers 12 and 14.

Further, the present semiconductor memory device requires no external power supply at the time of the write/ erase operations. Therefore, it is possible to reduce the power consumption.

Further, in the present semiconductor memory device, no F-N current flows through capacitor 10 and no hot carriers are implanted into capacitor 10. This prevents first gate dielectric layer 11 from being destroyed, thereby preventing reliability from dropping.

Figure 10:
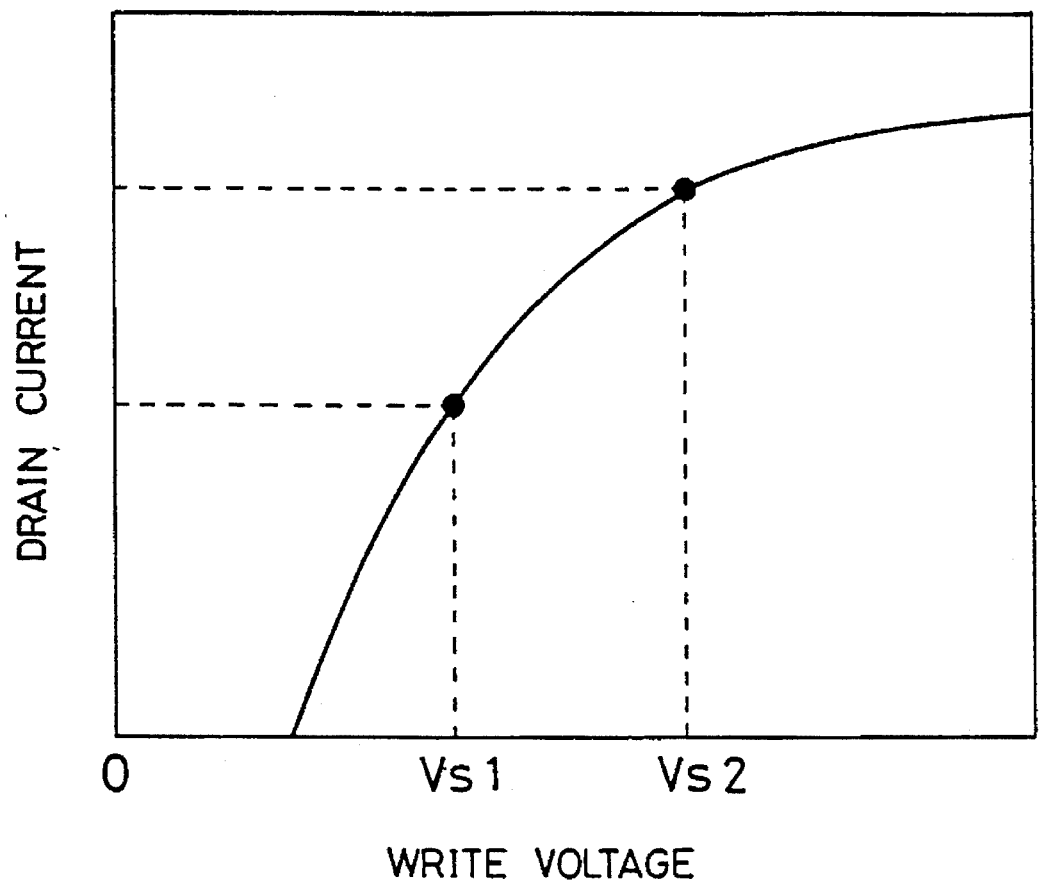
FIG. 10 is a diagram showing the relationship of the write voltage versus the drain current at the time when analog data is stored into a memory cell of an EEPROM of the first embodiment.

Additionally, it is possible for the present semiconductor memory device to store analog data. FIG. 10 is a graph illustrating the dependence of the logarithm of Id (transistor drain current) upon $V_w$ (write voltage). As shown in FIG. 10, if $V_{s1} \leq V_w \leq V_{s2}$, then superior linearity is obtained, and by use of this superior linearity it becomes possible to store analog data.

Preferably, the film thickness of carrier migration layer 13 is so thick as to increase dipole moment resulting from polarization. However, if materials having a considerably high conductivity such as metals are used to form carrier migration layer 13, this causes areas in the vicinity of a boundary between carrier migration layer 13 and first (second) carrier capture layer 12 (14) to store carriers having a reverse polarity to those captured by first (second) carrier capture layer 12 (14). This reduces the dipole moment. In other words, a value, found by dividing the film thickness of carrier migration layer 13 by its dielectric constant, is preferably greater than a value found by dividing the film thickness of first (second) carrier capture layer 12 (14) by its dielectric constant. If it is so arranged that a value, found by dividing the film thickness of first (second) carrier capture layer 12 (14) by its dielectric constant, is lower than a value found by dividing the film thickness of carrier migration layer 13 by its dielectric constant, this makes a carrier localized spot narrow and reduces the variation in dipole moment as small as possible. That is, data is stored in a more accurate manner.

EXAMPLE 2

Figure 11A:
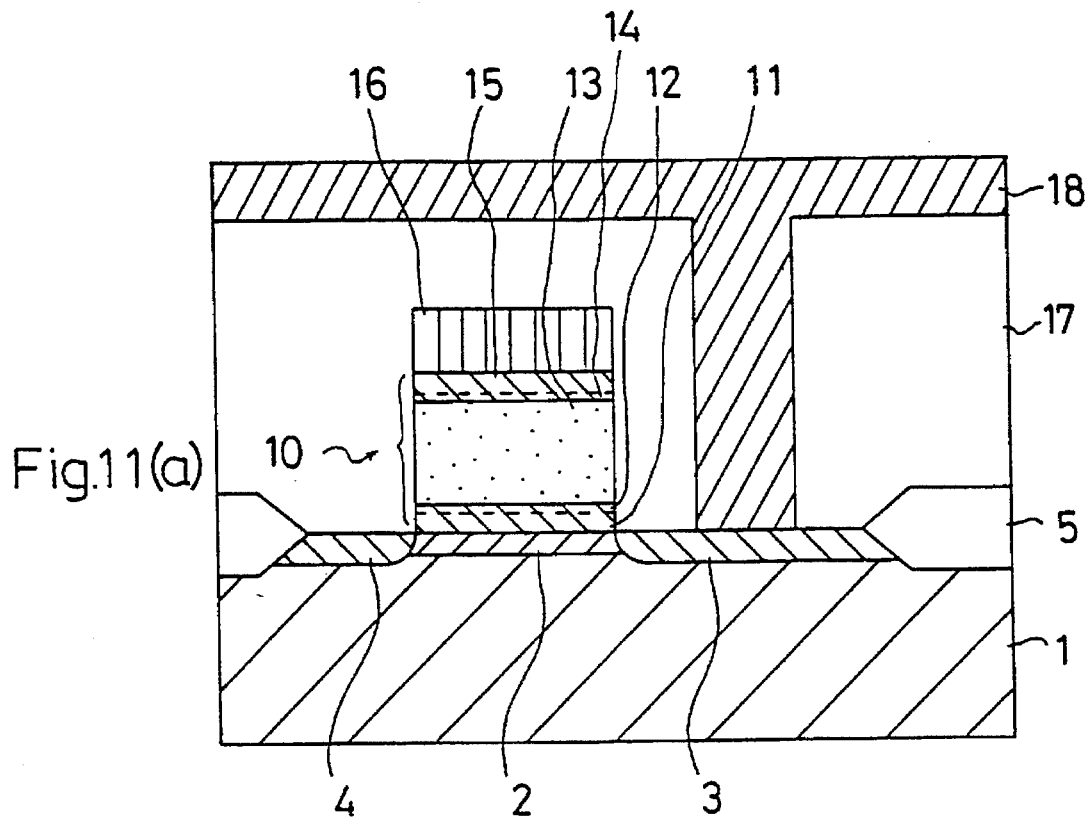
FIG. 11a shows in cross section an EEPROM memory cell having two carrier capture layers in accordance with a second embodiment of the present invention.
Figure 11B:
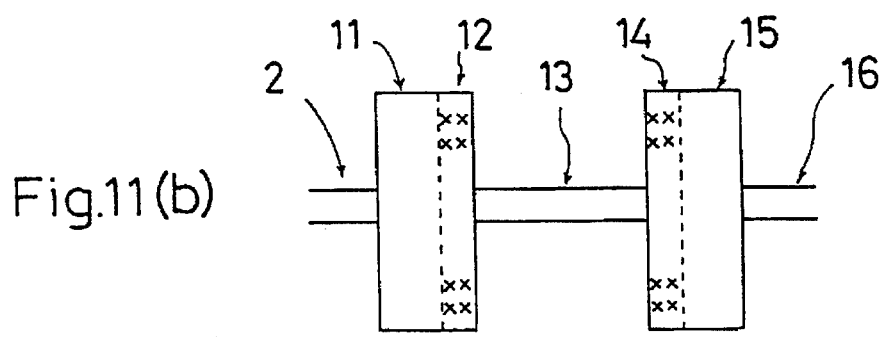
FIG. 11b is an associated energy band diagram.

A second preferred embodiment of the present invention is now explained below. FIG. 11a illustrates an organization of a memory cell according to the second embodiment. FIG. 11b shows an energy band structure from channel region 2 to control gate electrode 16 of the memory cell. Basically, a memory cell of the present embodiment is almost identical in structure with a memory cell of the first embodiment as shown in FIG. 1a. In the present embodiment, however, each of first and second gate dielectric layer 11 and 15 is formed by about 16 nm-thick silicon oxide. Each of first and second carrier capture layers 12 and 14 is made up of an area containing a trap formed by implanting first and second gate dielectric layer 11 and 15 with silicon ions.

Figure 12A:
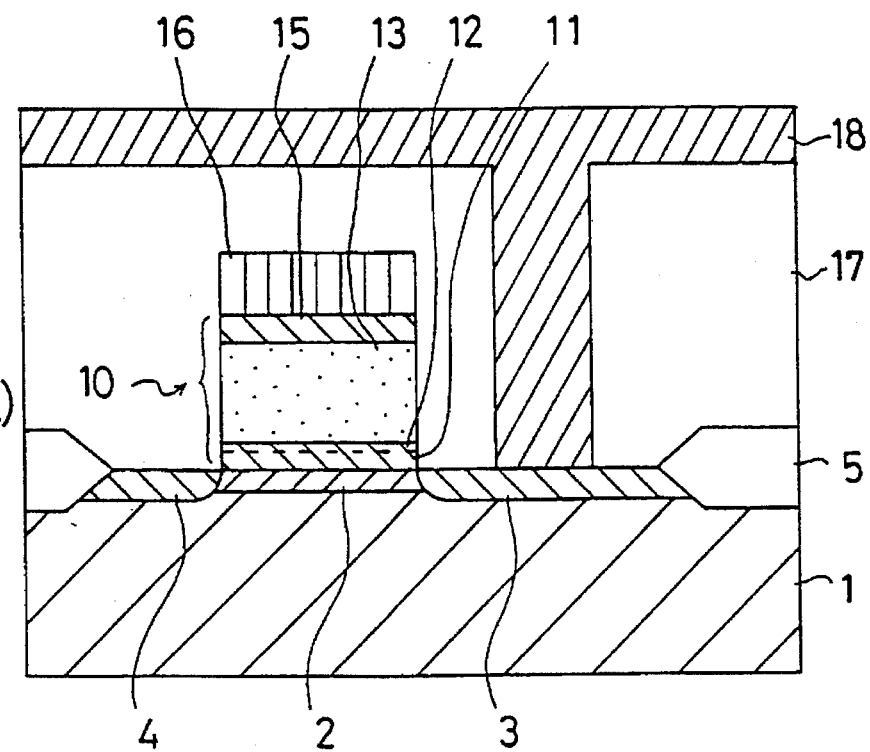
FIG. 12a shows in cross section an EEPROM memory cell having a single carrier capture layer in accordance with the second embodiment.
Figure 12B:
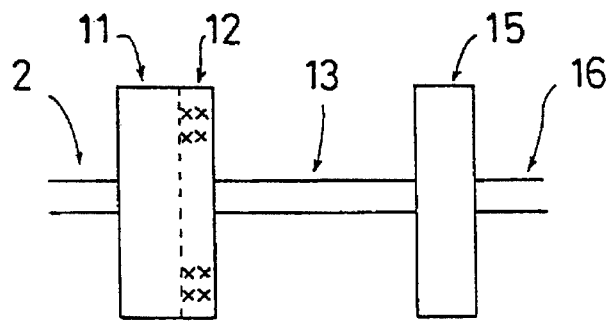
FIG. 12b is an associated energy band diagram.

FIG. 12a shows an organization of a memory cell less second carrier capture layer 14 which corresponds to an organization of a memory cell of FIG. 2a. FIG. 12b shows an associated energy band structure.

Referring now to FIGS. 13a–e, steps of the fabrication of a memory cell of the second embodiment is described.

Figure 13A:
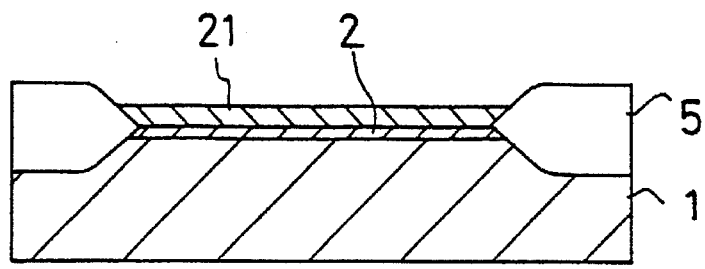
FIGS. 13a–13e depict in cross section subsequent steps of the fabrication of an EEPROM memory cell in accordance with the second embodiment.

Isolation 5 is formed on p-type semiconductor substrate 1. Next, as shown in FIG. 13a, an active surface area of p-type semiconductor substrate 1 is implanted with boron ions to form channel region 2. Thereafter, pyro-oxidation is performed at a temperature of 900 degrees centigrade to form silicon oxide layer 21 having a thickness of 16 nanometers.

Figure 13B:
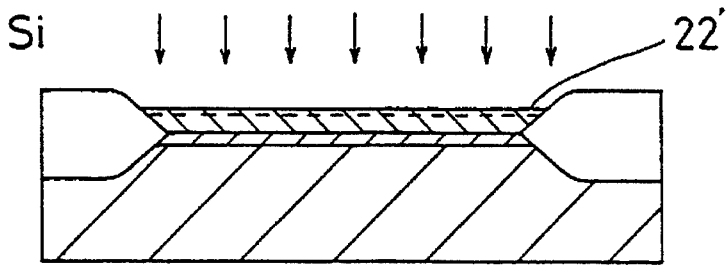
Figure 13C:
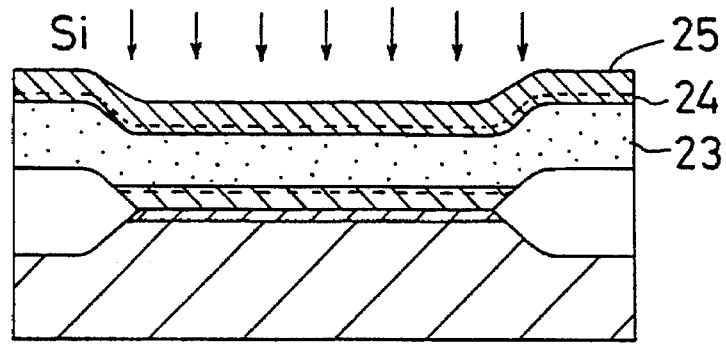

Next, as shown in FIG. 13b, from above silicon oxide layer 21, an implantation of silicon ions (Si+) is carried out, at a dose of $10^{16}$ cm$^{-2}$ and an energy of 3 keV, to a depth of several nanometers from the surface to form silicon implanted layer 22' Further, as shown in FIG. 13c, polysilicon layer 23, which is lightly doped with arsenic, is deposited about 400 nanometers at a temperature of 650 degrees centigrade, on top of silicon nitride layer 22.

Upon completion of the deposition of silicon oxide layer having a film thickness of 16 nanometers, an implantation of silicon ions (Si+) is carried out, at a dose of $10^{16}$ cm$^{-2}$ and an energy of 15 keV, from above silicon oxide layer 25 to form an ion implanted layer 24 in an area from a boundary surface between silicon oxide layer 25 and polysilicon layer 23 to a depth of several nanometers.

Figure 13D:
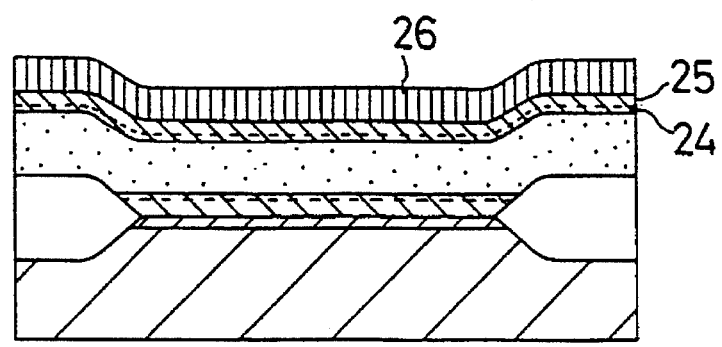
Figure 13E:
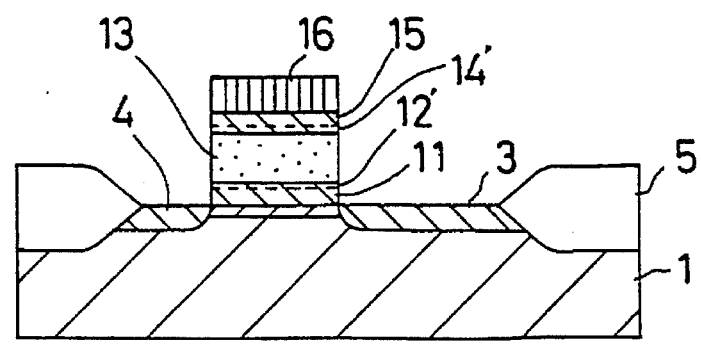

As shown in FIG. 13d, phosphorus-doped n-type polysilicon layer 26 is deposited about 250 nanometers at a temperature of, say, 650 degrees centigrade.

Thereafter, as shown in FIG. 3e, these layers formed are subjected to a patterning process so as to form first and second gate dielectric layers 11 and 15 of silicon oxide, first and second carrier capture layers 12 and 14 formed by means of implantation of silicon ions to the inside of first and second gate dielectric layers 11 and 15, carrier migration layer 13, and control gate electrode 16. By making use of a result of the patterning process as a mask, an ion implantation process is carried out to form drain region 3 and source region 4. The following fabrication steps are not described; however, interlayer dielectric film 17 and bit line 18 are formed by techniques known in the art. With the above-described fabrication steps, the memory cell structure of FIG. 11a is accomplished.

If a step of performing a silicon ion implantation on silicon oxide layer 25 is omitted this forms a memory cell of FIG. 12a.

In the present embodiment, silicon ions (Si+) are implanted to form first and second carrier capture layers 12 and 14 containing therein many traps. However, other than Si+, both Group IV compounds ions including Si+, Ge+, Sn+, and Pb+ and Group V compounds ions including P+, Sb+, and Bi+ may be available as long as they do not ill-influence the carrier concentration of n-type polysilicon layer 26. It is preferable to employ these Group IV compounds ions that have smaller mass numbers, in order to reduce trap formation areas.

FIGS. 14a–c are descriptive diagrams showing the relationship of the gate control voltage, $V_g$, versus the energy band structure/charge distribution, in the case of the memory cell of FIG. 11a. In the present embodiment, the relationship of the variation in carrier distribution versus the variation in $V_g$ is the same as that of FIG. 4a–c.

Therefore, the memory cell of FIG. 11a or FIG. 12a has the abilities of producing the previously described polarization hysteresis characteristics and transistor operational characteristics and of accomplishing analog data storage and binary, trinary, and multi-value storage.

Additionally, it is possible to read or erase data using a memory cell array formed by memory cells of FIG. 11a or FIG. 12a arranged to look like a grid.

The drain current-to-write voltage characteristics of FIG. 10 can be obtained from a transistor of the memory cell of the present embodiment. This permits analog data to be stored.

EXAMPLE 3

Figure 15:
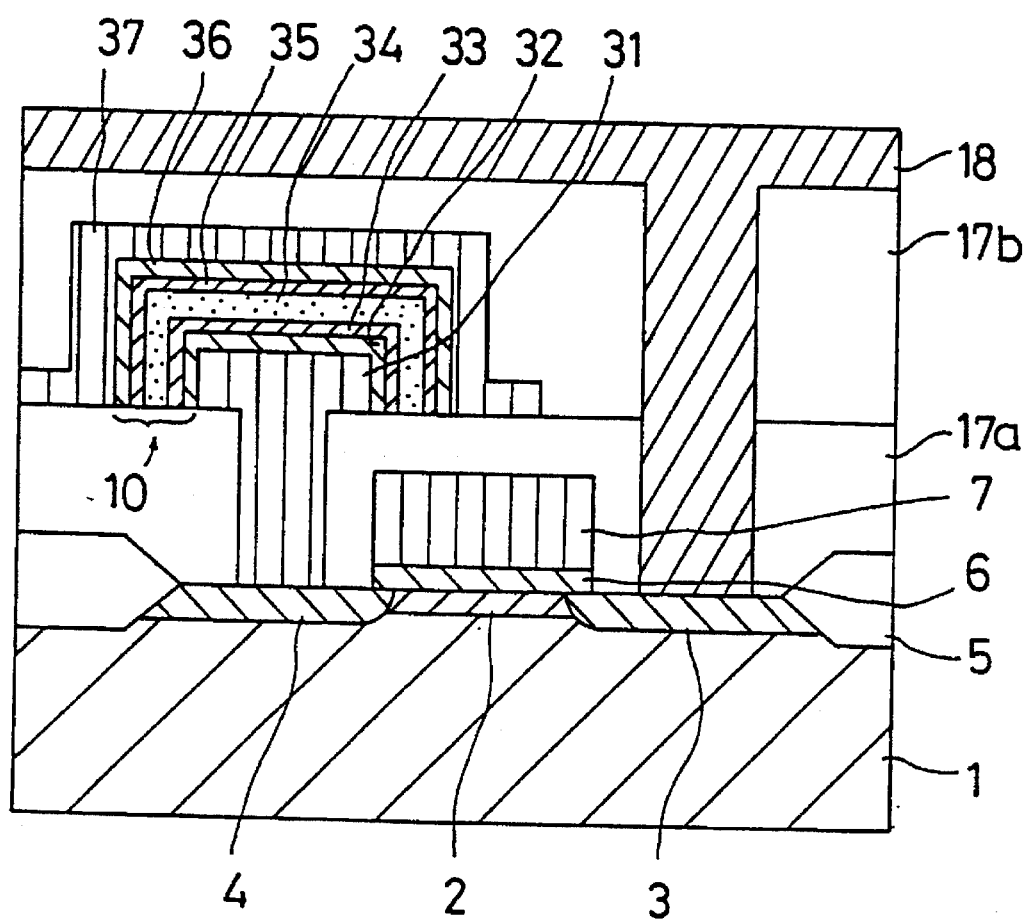
FIG. 15 shows in cross section a DRAM in accordance with a third embodiment of the present invention.

A third preferred embodiment of the present invention is now described by making reference to FIG. 15 which illustrates an organization of a DRAM of the present embodiment. In FIG. 15, these elements are shown: p-type silicon substrate 1, channel region 2, drain region 3, source region 4, isolation 5, gate oxide layer 6, gate electrode (word line) 7, first interlayer dielectric film 17a of silicon oxide, second interlayer dielectric film 17b of silicon oxide, bit line 18, storage node 31, and plate electrode 37. In the present embodiment, capacitor 10, made up of a plurality of layers described below, constitutes a so-called storage capacitor provided between storage node 31 serving as a first conductive element and plate electrode 37 serving as a second conductive element. More specifically, capacitor 10 is made up of first capacitance dielectric layer 32, first carrier capture layer 33, carrier migration layer 34, second carrier capture layer 35, and second capacitance dielectric layer 36. First capacitance dielectric layer 32 is made up of 10 nm-thick silicon oxide deposited on top of storage node 31. First carrier capture layer 33 is made up of 8 nm-thick silicon nitride deposited on top of first capacitance dielectric layer 32. Carrier migration layer 34 is made up of 400 nm-thick polysilicon deposited on first carrier capture layer 33. Second carrier capture layer 35 is made up of 8 nm-thick silicon nitride deposited on carrier migration layer 34. Second capacitance dielectric layer 36 is made up of 10 nm-thick silicon oxide deposited on second carrier capture layer 35.

Figure 16:
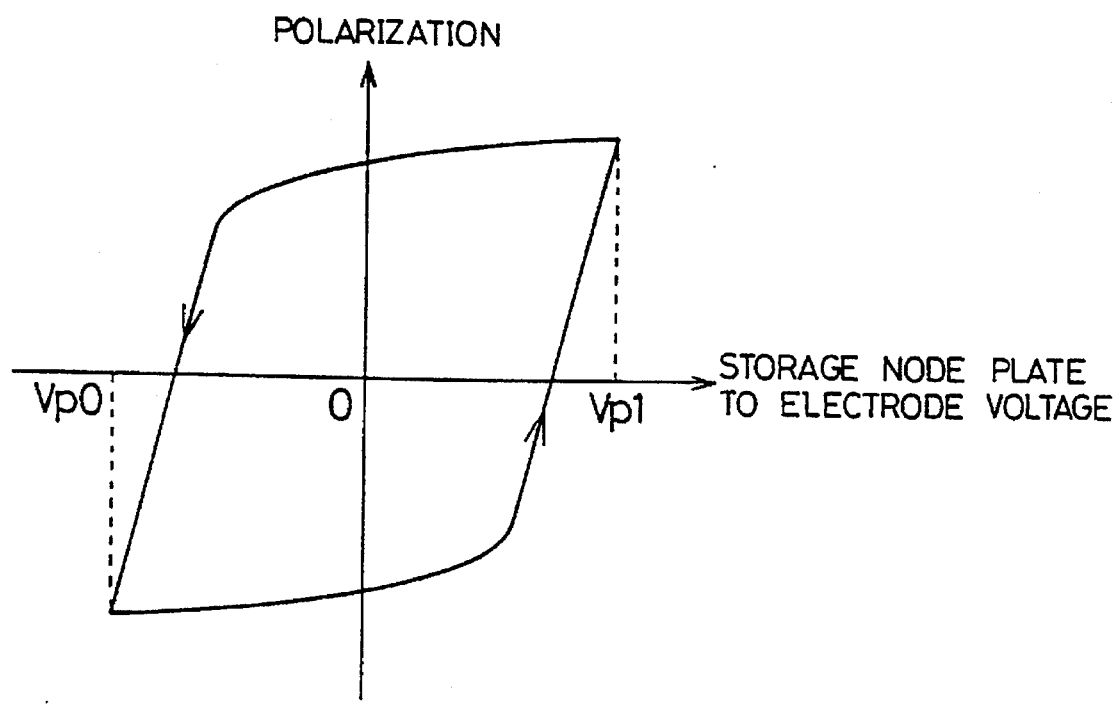
FIG. 16 is a diagram showing hysteresis characteristics of a polarization with respect to changes in the storage node-to-plate electrode voltage, in relation to DRAM of the third embodiment.

In a DRAM of the present embodiment, as in the first and second embodiments, the polarization hysteresis characteristics of FIG. 16 in accordance with a change in the voltage between storage node 31 and plate electrode 37 are obtained between first and second carrier capture layers 33 and 35. Therefore, by use of such polarization characteristics, data can be stored.

For the case of the present DRAM, capacitor 10 is so structured as to store information from a change in the distribution of internal carriers (polarization hysteresis), without performing carrier exchange. As a result of such arrangement, a DRAM having the ability of functioning as a nonvolatile memory can be realized. In this case, $V_{CC}$ (power supply voltage) is so set as to satisfy relationships of $V_{CC}/2 > V_{p1}$ and $V_{CC}/2 \geq -V_{p0}$, where both $V_{p1}$ and $V_{p0}$ are predefined voltages shown in FIG. 16, and the electric potential of plate electrode 37 is fixed at $V_{CC}/2$. In data write operation, bit line 18 is precharged to $V_{CC}/2$ and word line 17 selected is voltage-raised to turn a switching transistor on. Bit line 18 selected is set to have an electric potential of $V_{CC}$ in the case of the write operation of "1" and is set to have an electric potential of 0 V in the case of the write operation of "0". As a result, data ("1" or "0") is written to only a selected memory cell. To execute a data read operation, bit line 18 is precharged to $V_{CC}/2$, and word line 7 selected is voltage-raised to turn a switching transistor on. At this point, since an electric potential, induced to storage node 9 (i.e., either $V_{CC}$ in the case of "1" or 0 V in the case of "0"), is transmitted to bit line 18, either "1" data or "0" data is read out in accordance with the difference in current flowing through bit line 18. Additionally, data is retained because of a residual polarization occurring in capacitor 10.

Further, as in the second preferred embodiment, each carrier capture layer 33 and 35 may be formed by means of implantation of ions such as silicon ions and arsenic ions into a silicon oxide layer. It is not necessary to provide both first and second carrier capture layers 33 and 35. It is possible to provide only one of carrier capture layers 33 and 35.

Since a DRAM of the present embodiment has the same organization as ones of the first and second embodiments, its fabrication steps are not explained here.

EXAMPLE 4

Figure 17A:
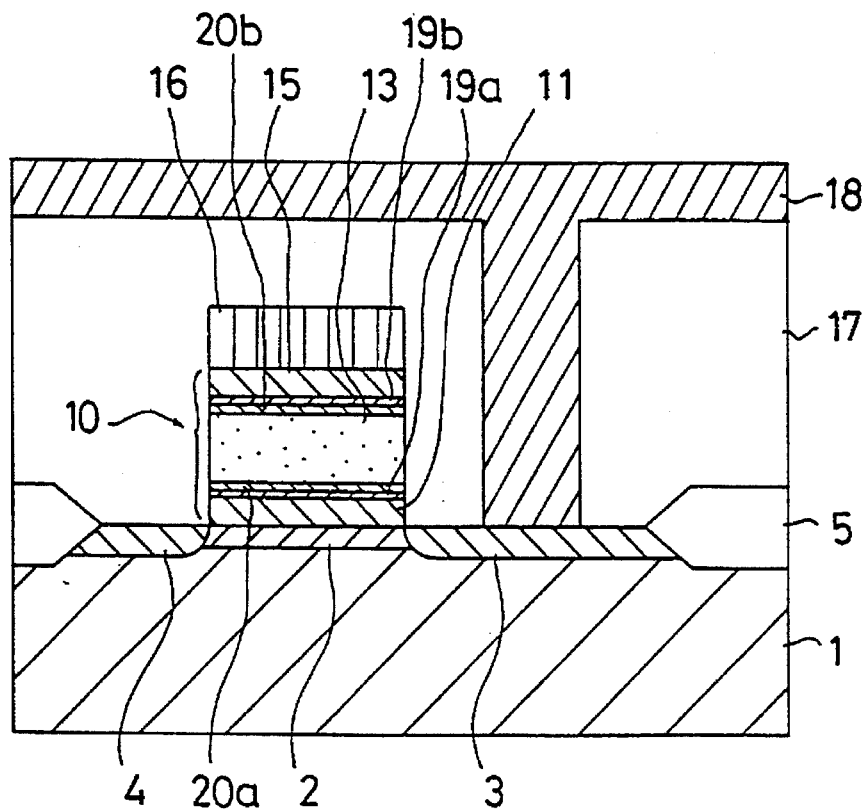
FIG. 17a shows in cross section an EEPROM memory cell in accordance with a fourth embodiment of the present invention.

A fourth preferred embodiment of the present invention is illustrated. FIG. 17a is a cross sectional view showing an organization of a memory cell of the present embodiment. Since the memory cell of FIG. 17a is similar in structure to the one of FIG. 1a, like elements are indicated by the same reference numerals, and their descriptions are omitted. In the present embodiment, in capacitor 10, first carrier store layer 19a of amorphous silicon is provided between first gate dielectric layer 11 and carrier migration layer 13. Provided between first carrier store layer 19a and carrier migration layer 13 is first tunnelling oxide layer 20a that is a 4-nm thick silicon oxide. Likewise, sandwiched between second dielectric layer 15 and carrier migration layer 13 are second carrier store layer 19b and second tunnelling oxide layer 20b.

Figure 17B:
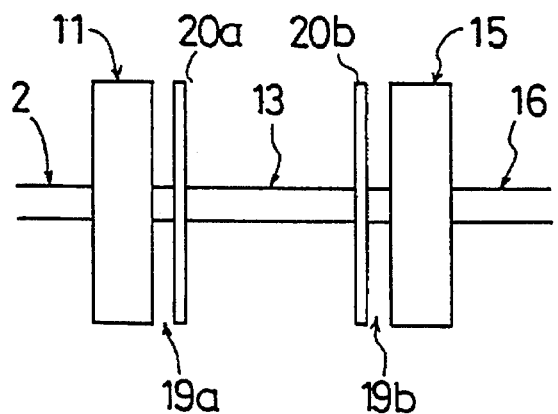
FIG. 17b is an associated energy band diagram.
Figure 19A:
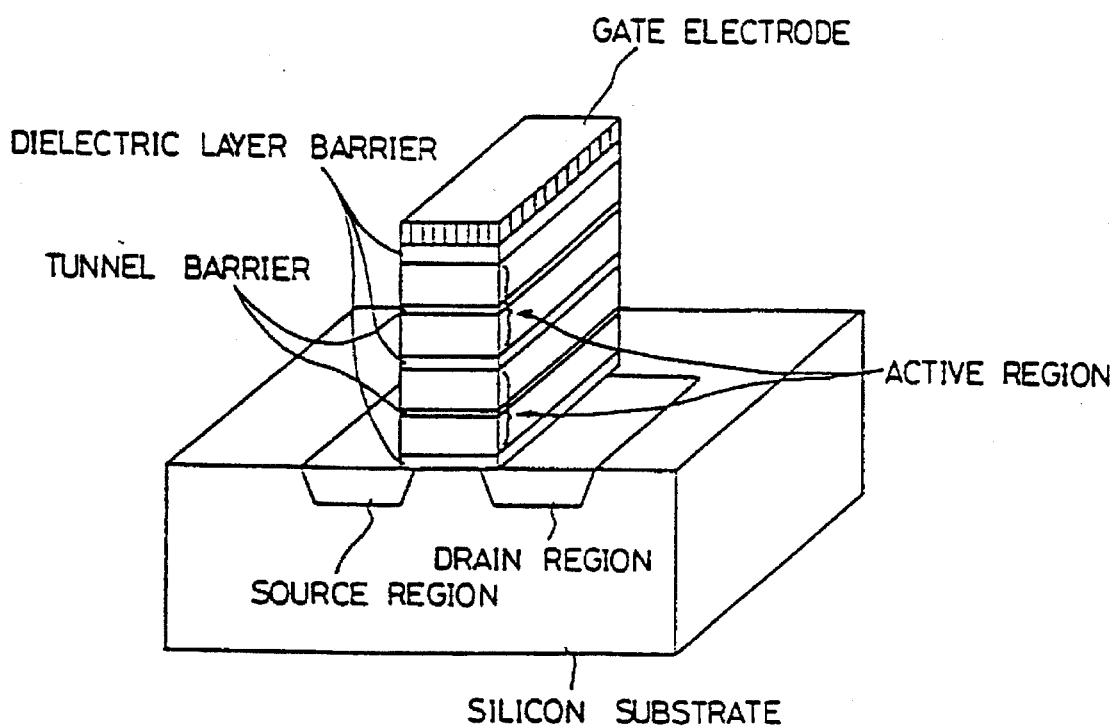
FIG. 19a shows in cross section a conventional nonvolatile semiconductor memory device and FIG. 19b is an associated band diagram.
Figure 19B:
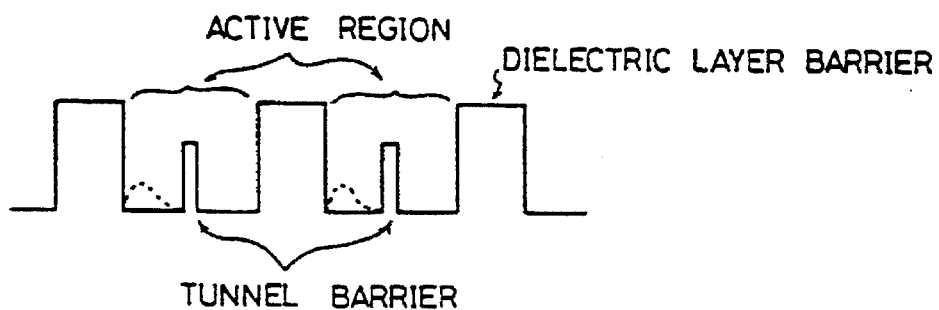

FIG. 17b shows an associated memory cell energy band structure of such a memory cell. As shown in the figure, each carrier store layer 19a and 19b has an energy level capable of allowing carriers to exist in a stable state, and each tunnelling oxide layer 20a and 20b has a film thickness capable of permitting tunnelling.

FIGS. 18a–b shows the relationship of the variation in $V_g$ (control gate voltage) versus the variation in carrier distribution. If $V_g = V_{w1}$, then electrons of first carrier store layer 19a are released to carrier migration layer 13, and these released electrons are captured by second carrier store layer 19b, and First carrier store layer 19a becomes a positive pole while on the other hand second carrier store layer 19b becomes a negative pole, and Finally capacitor 10 enters a polarization state (see FIG. 18a). IF, then, $V_g$ is set at $V_{w0}$, electrons of second carrier store layer 19b are released to carrier migration layer 13, and these released electrons are captured by first carrier store layer 19a, and first carrier store layer 19a becomes a negative pole, while second carrier store layer 19b becomes a positive pole, and finally capacitor 10 enters a polarization state.

As in the first and second embodiments, it is possible to perform trinary value storage and multivalue storage by changing the degree of polarization.

Therefore, it is possible to form a flash EEPROM having the same functions as the ones of the first and second embodiments or a DRAM having the same functions as the one of the third embodiment, by making use of a memory cell having the above-described structure.

The invention claimed is:

1. A semiconductor memory device comprising:

at least one unit memory cell including a capacitor to store information, said capacitor being provided between a first conductive element and a second conductive element:

said capacitor including:

a first barrier layer which is located next to said first conductive element and which has an energy barrier that is so high as to impede the passage of carriers;

wherein said first barrier layer and a second conductive layer inhibit passage of the carriers when the voltage for write/erase operation is applied between said first conductive element and said second conductive element;

a carrier migration layer which faces said first conductive element with said first barrier layer in between and which has an energy level capable for permitting the migration of carriers;

wherein said carrier migration layer is composed of a conductive material or a semiconductor material, and is capable of permitting migration of carriers when a voltage for write/erase operation is applied between said first conductive element and said second conductive element;

a second barrier layer which is provided between said carrier migration layer and said second conductive element and which has an energy barrier that is so high as to impede the passage of carriers; and at least one carrier capture layer which is provided between said carrier migration and said first barrier layer or between said carrier migration layer and said second barrier layer or within at least one of said first barrier layer and said second barrier layer and which has an energy level capable of capturing carriers;

wherein said capacitor is formed in a way such that, by changing a carrier capture state of said carrier capture layer in accordance with a change in binary voltage applied between said first conductive element and said second conductive element, at least two different polarization states can be generated and stored.

2. The semiconductor memory device of claim 1 wherein said carrier capture layer is made up of at least one thin film that has an energy level capable of capturing carriers.

3. The semiconductor memory device of claim 2 wherein:

said each barrier layer is made up of silicon oxide; and said carrier capture layer is made up of at least silicon nitride.

4. The semiconductor memory device of claim 1 wherein said carrier migration layer is formed by a semiconductor material having a low carrier concentration.

5. The semiconductor memory device of claim 1 wherein said at least one carrier capture layer is within at least one of said first barrier layer and said second barrier layer and includes a trap formed in the vicinity of an interface between said each barrier layer and said carrier migration layer.

6. The semiconductor memory device of claim 5 wherein:

either one of said first barrier layer and said second barrier layer is formed by silicon oxide;

said carrier migration layer is formed by silicon having a low carrier concentration; and said trap of said carrier capture layer is formed by a Group IV compound that is introduced into said silicon oxide barrier layer.

7. The semiconductor memory device of claim 1 wherein a value, found by dividing said carrier migration layer's film thickness by said carrier migration layer's dielectric constant, is greater than a value found by dividing said each barrier layer's film thickness by said each barrier layer's dielectric constant.

8. The semiconductor memory device of claim 2 wherein a value, found by dividing said carrier capture layer's film thickness by said carrier capture layer's dielectric constant is lower than a value found by dividing said carrier migration layer's film thickness by said carrier migration layer's dielectric constant.

9. The semiconductor memory device of claim 1 wherein a tunnelling barrier layer is provided between said carrier capture layer and said carrier migration layer, said tunnelling barrier layer being formed in a way such that carriers can pass through said tunnelling barrier layer by tunnelling.

10. The semiconductor memory device of claim 1 wherein said carrier capture layer is formed on both sides of said carrier migration layer.

11. The semiconductor memory device of claim 10 wherein a tunnelling barrier layer is provided between said each carrier capture layer and said carrier migration layer, said tunnelling barrier layer being formed in a way such that carriers can pass through said tunnelling barrier layer by tunnelling.

12. A semiconductor memory device comprising:

at least one unit memory cell including a capacitor to store information, said capacitor being provided between a first conductive element and a second conductive element:

said capacitor including:

a first barrier layer which is located next to said first conductive element and which has an energy barrier that is so high as to impede the passage of carriers;

wherein said first barrier layer and a second conductive layer inhibit passage of the carriers when the voltage for write/erase operation is applied between said first conductive element and said second conductive element;

a carrier migration layer which faces said first conductive element with said first barrier layer in between and which has an energy level lower than an energy level of said first barrier layer and capable of permitting the migration of carriers;

wherein said carrier migration layer is composed of a conductive material or a semiconductor material, and is capable of permitting migration of carriers when a voltage for write/erase operation is applied between said first conductive element and said second conductive element;

a second barrier layer which is provided between said carrier migration layer and said second conductive element and which has an energy barrier that is so high as to impede the passage of carriers;

two carrier store layers provided between said carrier migration layer and said each barrier layer, said each carrier store layer having an energy level capable of allowing carriers to exist in a stable state; and two tunneling barrier layers provided between said each carrier store layer and said carrier migration level, said each tunneling barrier layer having a structure enabling the passage of carriers;

wherein said capacitor is formed in a way such that, by changing a carrier store state of said each carrier store layer in accordance with a change in binary voltage applied between said first conductive element and said second conductive element, as least two different polarization states can be generated and stored as stored data.

13. The semiconductor memory device of claim 12 wherein a value, found by dividing said carrier migration layer's film thickness by said carrier migration layer's dielectric constant, is greater than a value found by dividing said each barrier layer's film thickness by said each barrier layer's dielectric constant.

14. The semiconductor memory device of claims 1, 10 or 12 wherein:

said at least one unit memory cell is formed by a flash electrically erasable programmable read-only memory (EEPROM);

said first conductive element of said at least one unit memory cell forms a channel region between a source region and a drain region of said first EEPROM;

said second conductive element of said at least one unit memory forms a control gate electrode of said flash EEPROM; and said capacitor is formed by a floating gate of said flash EEPROM and dielectric layers above and below said floating gate.

15. The semiconductor memory device of claims 1, 10, or 12 wherein:

said unit memory cell is a dynamic random access memory (DRAM) memory cell, said DRAM memory cell comprising a switching transistor, a storage node, a plate electrode, and a storage capacitor connected between said storage node and said plate electrode; and said capacitor functions as said storage capacitor.

16. The semiconductor memory device of claim 14 further comprising:

a first voltage generator connected to the first conductive element; and a second voltage generator connected to the second conductive element; and data read means; and bit lines connected to the drain region of each said at least one unit memory cell; and word lines connected to the control gate electrode of each said at least one unit memory cell;

wherein:

said first voltage generator and said second voltage generator produce a first potential difference between said first and second conductive elements thereby writing a resulting polarization state occurring in said capacitor as "1" data, while, on the other hand, said first voltage generator and said second voltage generator produce a second potential difference opposite to said first potential difference between said first and second conductive elements thereby writing a resulting polarization state occurring in said capacitor as "0" data; and said first voltage generator and said second voltage generator produce between said first and second conductive elements a potential difference which is lower than any of said first and second potential differences and which does not affect any of said intracapacitor polarization states via said bit lines and said word lines, said data read means detecting a change in current flowing in said bit lines caused by said intracapacitor polarization states, thereby reading the written data.

17. The semiconductor memory device of claim 14 further comprising:

a first voltage generator connected to the first conductive element; and a second voltage generator connected to the second conductive element; and data read means; and bit lines connected to the drain region of each said at least one unit memory cell; and word lines connected to the control gate electrode of each said at least one unit memory cell;

wherein:

said first voltage generator and said second voltage generator produce at least three different potential differences between said first and second conductive elements thereby writing resulting three or more polarization states as trinary or more data; and said first voltage generator and said second voltage generator produce between said first and second conductive elements a potential difference which is lower than any of said at least three different potential differences and which does not affect any of said intracapacitor polarization states via said bit lines and said word lines, said data read means detecting a change in current flowing in said bit lines caused by said intracapacitor polarization states, thereby reading the written data.

18. The semiconductor memory device of claim 14 further comprising:

a first voltage generator connected to the first conductive element; and a second voltage generator connected to the second conductive element; and data read means; and bit lines connected to the drain region of each said at least one unit memory cell; and word lines connected to the control gate electrode of each said at least one unit memory cell;

wherein:

said first voltage generator and said second voltage generator produce between said first and second conductive elements a potential difference within a predefined range determined by a polarization characteristic of said capacitor, thereby writing a resulting polarization state that continuously varies as analog data; and said first voltage generator and said second voltage generator produce between said first and second conductive elements a potential difference which is lower than a low limit value of said predefined range and which does not affect any of said intracapacitor polarization states via said bit lines and said word lines, said data read means detecting a change in current flowing in said bit lines caused by said intracapacitor polarization states, thereby reading the written data.

* * * * *